United States Patent
Kim et al.

(10) Patent No.: US 9,355,911 B2
(45) Date of Patent: May 31, 2016

(54) FINE PATTERNING METHODS AND METHODS OF FABRICATING SEMICONDUCTOR DEVICES USING THE SAME

(71) Applicants: Gyeong-seop Kim, Suwon-si (KR); Sungbong Kim, Suwon-si (KR); Myeongcheol Kim, Suwon-si (KR)

(72) Inventors: Gyeong-seop Kim, Suwon-si (KR); Sungbong Kim, Suwon-si (KR); Myeongcheol Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/711,801

(22) Filed: May 14, 2015

(65) Prior Publication Data
US 2016/0043001 A1   Feb. 11, 2016

(30) Foreign Application Priority Data
Aug. 5, 2014   (KR) .................. 10-2014-0100636

(51) Int. Cl.
| | |
|---|---|
| H01L 21/31 | (2006.01) |
| H01L 21/30 | (2006.01) |
| H01L 21/46 | (2006.01) |
| H01L 21/8234 | (2006.01) |
| H01L 21/308 | (2006.01) |

(Continued)

(52) U.S. Cl.
CPC .... *H01L 21/823418* (2013.01); *H01L 21/3086* (2013.01); *H01L 21/30604* (2013.01); *H01L 21/31111* (2013.01); *H01L 29/6656* (2013.01)

(58) Field of Classification Search
CPC ......... H01L 21/31; H01L 27/11; H01L 23/58; H01L 21/30; H01L 21/82

USPC ......... 438/700–704, 296, 585–586, 689, 482; 257/368, 401, E21.214, E21.215, 257/E21.218, E21.231
See application file for complete search history.

(56) References Cited

U.S. PATENT DOCUMENTS

| | | |
|---|---|---|
| 8,003,543 B2 | 8/2011 | Koh et al. |
| 8,242,022 B2 | 8/2012 | Kim |

(Continued)

FOREIGN PATENT DOCUMENTS

KR   10-2013-0021658 A   3/2013

OTHER PUBLICATIONS

Bell, Graham; Semiconductor Design Technology and System Drivers Roadmap: Process and Status (http://www10.edacafe.com/blogs/realintent/2013/08/15/semiconductor-design-technology-and-system-drivers-roadmap-process-and-status-part-4/) Aug. 15, 2013.

*Primary Examiner* — Amar Movva
*Assistant Examiner* — Sheikh Maruf
(74) *Attorney, Agent, or Firm* — Myers Bigel & Sibley, P.A.

(57) ABSTRACT

A fine-patterning method includes forming a mask layer with lower and upper mask layers on an underlying layer, forming a pair of sacrificial patterns on the mask layer, forming a connection spacer between the sacrificial patterns and first spacers that are spaced apart from each other with the pair of sacrificial patterns interposed therebetween and covering side surfaces of the sacrificial patterns, etching the upper mask layer using the first spacers and the connection spacer as an etch mask to form upper mask patterns, forming second spacers to cover side surfaces of the upper mask patterns, etching the lower mask layer using the second spacers as an etch mask to form lower mask patterns, and etching the underlying layer using the lower mask patterns as an etch mask.

20 Claims, 29 Drawing Sheets

(51) Int. Cl.
*H01L 21/306* (2006.01)
*H01L 21/311* (2006.01)
*H01L 29/66* (2006.01)

(56) References Cited

U.S. PATENT DOCUMENTS

| | | |
|---|---|---|
| 8,338,305 B2 | 12/2012 | Chen et al. |
| 8,653,630 B2 | 2/2014 | Liaw et al. |
| 8,669,186 B2 | 3/2014 | LiCausi |
| 8,969,206 B1 * | 3/2015 | Sel .................... H01L 21/32139 216/46 |
| 2007/0148945 A1 | 6/2007 | Ryou |
| 2007/0158756 A1 * | 7/2007 | Dreeskornfeld H01L 21/823412 257/374 |
| 2007/0249170 A1 * | 10/2007 | Kewley ............... H01L 21/0337 438/706 |
| 2008/0111184 A1 * | 5/2008 | Beintner ............. H01L 29/7851 257/327 |
| 2010/0093173 A1 * | 4/2010 | Park ..................... H01L 21/3086 438/689 |
| 2010/0112489 A1 * | 5/2010 | Fischer ............... H01L 21/0338 430/319 |
| 2010/0197096 A1 * | 8/2010 | Johnson .......... H01L 21/823431 438/268 |
| 2010/0221920 A1 * | 9/2010 | Sandhu ............... H01L 21/0337 438/696 |
| 2011/0117743 A1 * | 5/2011 | Bai ..................... H01L 21/0337 438/696 |
| 2011/0136340 A1 * | 6/2011 | Sim .................... H01L 21/0337 438/669 |
| 2012/0208361 A1 * | 8/2012 | Ha ..................... H01L 21/0337 438/597 |
| 2013/0034963 A1 | 2/2013 | Chung et al. |
| 2013/0048603 A1 | 2/2013 | Kim et al. |
| 2013/0069167 A1 | 3/2013 | Zhu et al. |
| 2013/0115778 A1 * | 5/2013 | Xue ................... H01L 21/02181 438/703 |
| 2013/0280903 A1 | 10/2013 | Liaw et al. |
| 2014/0024219 A1 * | 1/2014 | Jung ........................ B32B 3/10 438/703 |

* cited by examiner

FINE PATTERNING METHODS AND METHODS OF FABRICATING SEMICONDUCTOR DEVICES USING THE SAME

CROSS-REFERENCE TO RELATED APPLICATION

This U.S. non-provisional patent application claims priority under 35 U.S.C. §119 to Korean Patent Application No. 10-2014-0100636, filed on Aug. 5, 2014 in the Korean Intellectual Property Office, the entire content of which is hereby incorporated herein by reference.

BACKGROUND

Example embodiments of the inventive concepts relate to methods of forming fine patterns and to related methods of fabricating semiconductor devices using such fine patterning techniques.

In order to realize a highly-integrated semiconductor device, it is necessary to form fine patterns. For example, one method of increasing the number of devices formed within a given area is to reduce the size of the patterns used to form the devices. In other words, patterns should be formed in such a way that a pitch thereof or a sum of a width of each pattern and a space between two adjacent patterns is reduced. However, as the pattern sizes are reduced the resolution in a photolithography processes are being stretched to the limit, and thus, it becomes more and more difficult to form patterns having finer pitches.

SUMMARY

Example embodiments of the inventive concepts provide a fine-patterning method capable of realizing a variety of pitches of successively-arranged patterns and a method of fabricating semiconductor devices using such methods.

According to example embodiments of the inventive concepts, a fine-patterning method may include forming a mask layer on an underlying layer, the mask layer including a first mask layer on the underlying layer and a second mask layer between the underlying layer and the first mask layer, forming a pair of sacrificial patterns on the mask layer, forming a connection spacer filling a space between the sacrificial patterns and first spacers that are spaced apart from each other with the sacrificial patterns interposed therebetween, the first spacers covering respective outer side surfaces of the sacrificial patterns, etching the first mask layer using the first spacers and the connection spacer as an etch mask to form first mask patterns, forming second spacers to cover side surfaces of each of the first mask patterns, etching the second mask layer using the second spacers as an etch mask to form second mask patterns, and etching the underlying layer using the second mask patterns as an etch mask.

In example embodiments, the connection spacer and the first spacers may be formed by forming a first spacer layer on the mask layer that conformally covers the sacrificial patterns, and anisotropically etching the first spacer layer to expose top surfaces of the sacrificial patterns and the mask layer. A first distance between the sacrificial patterns may be smaller than or substantially equal to two times a thickness of the first spacer layer.

In example embodiments, the first distance may be one to two times the thickness of the first spacer layer.

In example embodiments, the sacrificial patterns each extend in a first direction and may be spaced apart from each other by the first distance in a second direction that is substantially perpendicular to the first direction. Each of the first spacers may have a maximum width in the second direction that is substantially equal to the thickness of the first spacer layer.

In example embodiments, the sacrificial patterns extend in a first direction and may be spaced apart from each other by a first distance in a second direction that is substantially perpendicular to the first direction. A maximum width of the connection spacer may be substantially equal to the first distance between the sacrificial patterns.

In example embodiments, the sacrificial patterns are spaced apart from each other along a second direction, and a maximum width of the connection spacer in the second direction may be smaller than or substantially equal to two times a maximum width of each of the first spacers in the second direction.

In example embodiments, the maximum width of the connection spacer may be one to two times the maximum width of each of the first spacers.

In example embodiments, the method may further include removing the sacrificial patterns before forming the first mask patterns, and removing the first spacers and the connection spacer after the forming of the first mask patterns. The forming of the second spacers may include forming a second spacer layer on the second mask layer to conformally cover the first mask patterns, and anisotropically etching the second spacer layer to expose top surfaces of the first mask patterns and the second mask layer.

In example embodiments, the connection spacer may include the same material as the first spacers.

In example embodiments, the method may further include providing a substrate below the underlying layer. The sacrificial patterns may be spaced apart from each other in a second direction, and the underlying layer may be etched to form lower openings that expose the substrate, the lower openings including first, second, and third lower openings which are arranged along the second direction and whose widths are proportional to a width of the sacrificial pattern, a maximum width of one of the first spacers, and a maximum width of the connection spacer, respectively, when measured in the second direction.

In example embodiments, forming the connection spacer and the first spacers may include forming a first spacer layer on the mask layer that conformally covers the sacrificial patterns, and anisotropically etching the first spacer layer to expose top surfaces of the sacrificial patterns and the mask layer. The maximum width of the first spacer may be controlled by adjusting a thickness of the first spacer layer.

In example embodiments, the maximum width of the connection spacer may be controlled by adjusting a distance between the sacrificial patterns.

In example embodiments, the widths of the first, second, and third lower openings may be different from each other.

According to example embodiments of the inventive concepts, a method of fabricating a semiconductor device may include forming active patterns that protrude upward from a top surface of a substrate, and forming a gate structure that crosses the active patterns. The active patterns may be formed by sequentially forming an underlying layer and a mask layer on the substrate, the mask layer including a first mask layer on the underlying layer and a second mask layer between the underlying layer and the first mask layer, forming a pair of sacrificial patterns on the mask layer, forming first spacers and a connection spacer, the first spacers spaced apart from each other with the pair of the sacrificial patterns interposed therebetween, the first spacers covering respective outer side surfaces of the sacrificial patterns, the connection spacer filling a space between the pair of the sacrificial patterns, etching the first mask layer using the first spacers and the connection spacer as an etch mask to form first mask patterns, forming second spacers to cover side surfaces of each of the first mask patterns, etching the second mask layer using the second spacers as an etch mask to form second mask patterns, etching the underlying layer using the second mask patterns as an etch mask to form lower mask patterns, and etching an upper portion of the substrate using the lower mask patterns as an etch mask.

In example embodiments, the sacrificial patterns may extend parallel to a first direction and may be spaced apart from each other in a second direction that crosses the first direction. The active patterns may include a first active pattern and a second active pattern, each of which extend parallel to the first direction and are arranged adjacent to and spaced apart from each other in the second direction. Further, the first and second active patterns may have different conductivity types from each other. A first distance between the first and second active patterns may be proportional to a width of each of the sacrificial patterns in the second direction.

In example embodiments, the active patterns may further include a third active pattern, which is spaced apart from the first active pattern with the second active pattern interposed therebetween and has the same conductivity type as the second active pattern. A second distance between the second and third active patterns may be proportional to a maximum width of each of the first spacers in the second direction.

In example embodiments, the first spacers and the connection spacer may be formed by forming a first spacer layer on the mask layer that conformally covers the sacrificial patterns, and anisotropically etching the first spacer layer to expose top surfaces of the sacrificial patterns and the mask layer. The maximum width of each of the first spacers may be controlled by adjusting a thickness of the first spacer layer.

In example embodiments, the maximum width of each of the first spacers may be substantially equal to the thickness of the first spacer layer.

In example embodiments, the active patterns may further include a fourth active pattern, which is spaced apart from the second active pattern with the first active pattern interposed therebetween and has the same conductivity type as the first active pattern. A third distance between the first and fourth active patterns may be proportional to a maximum width of the connection spacer in the second direction.

In example embodiments, the maximum width of the connection spacer may be controlled by adjusting a distance between the sacrificial patterns.

In example embodiments, the maximum width of the connection spacer may be substantially equal to the distance between the sacrificial patterns.

In example embodiments, the sacrificial patterns may extend in a first direction and may be spaced apart from each other in a second direction that crosses the first direction. The first spacers and the connection spacer may be formed by forming a first spacer layer on the mask layer that conformally covers the sacrificial patterns, and anisotropically etching the first spacer layer to expose top surfaces of the sacrificial patterns and the mask layer. A first distance between the sacrificial patterns may be smaller than or substantially equal to two times a thickness of the first spacer layer.

In example embodiments, the first distance may be one to two times the thickness of the first spacer layer.

In example embodiments, the method may further include removing the sacrificial patterns before forming the first mask patterns, and removing the first spacers and the connection spacer after the forming of the first mask patterns. The second spacers may be formed by forming a second spacer layer on the second mask layer to conformally cover the first mask patterns, and anisotropically etching the second spacer layer to expose top surfaces of the first mask patterns and the second mask layer.

In example embodiments, the connection spacer may include the same material as the first spacers.

According to example embodiments of the inventive concepts, a method of fabricating a semiconductor device may include forming a first mask layer on a substrate; forming a first sacrificial pattern and a second sacrificial pattern on the first mask layer, the first and second sacrificial patterns each extending in a first direction and spaced apart from each other in a second direction that crosses the first direction, each of the first and second sacrificial patterns having first and second sidewalls that extend in the first direction; forming a first spacer layer on the first mask layer that conformally covers the first and second sacrificial patterns; anisotropically etching the first spacer layer to form a connection spacer that extends from the first sidewall of the first sacrificial pattern to the first sidewall of the second sacrificial pattern and to form respective first spacers on the second sidewalls of the first and second sacrificial patterns; etching the substrate to form first and second active patterns that have a first conductivity type and third and fourth active patterns that have a second conductivity type that is opposite the first conductivity type. A second distance between the third active pattern and the fourth active pattern is equal to a width of the first spacer in the second direction, and a third distance between the first active pattern and the second active pattern is equal to a width of the connection spacer in the second direction.

In example embodiments, each of the first spacers may have a maximum width in the second direction that is substantially equal to the thickness of the first spacer layer.

In example embodiments, a first distance between the second active pattern and the third active pattern may be less than a width of the first sacrificial pattern in the second direction.

In example embodiments, etching the substrate to form first and second active patterns that have the first conductivity type and third and fourth active patterns that have the second conductivity type that is opposite the first conductivity type may comprise:etching the first mask layer using the first spacers and the connection spacer as an etch mask to form first mask patterns; forming second spacers to cover side surfaces of each of the first mask patterns; and etching a second mask layer that is between the first mask layer and the substrate using the second spacers as an etch mask to form second mask patterns.

In example embodiments, the method may further include etching an underlying layer that is between the second mask layer and the substrate using the second mask patterns as an etch mask.

In example embodiments, a distance between the sacrificial patterns may be smaller than or substantially equal to two times a thickness of the first spacer layer.

In example embodiments, the first through fourth active patterns may be arranged in numerical order along the second direction.

BRIEF DESCRIPTION OF THE DRAWINGS

Example embodiments will be more clearly understood from the following brief description taken in conjunction with the accompanying drawings. The accompanying drawings illustrate non-limiting, example embodiments as described herein.

FIGS. 9A through 16A are plan views illustrating a method of fabricating a semiconductor device using a fine-patterning method according to example embodiments of the inventive concepts.

FIGS. 9B through 16B are sectional views taken along line I-I' of FIGS. 9A through 16A, respectively.

FIGS. 17A through 19A are plan views illustrating another method of fabricating a semiconductor device using a fine-patterning method according to example embodiments of the inventive concepts.

FIGS. 17B through 19B are sectional views taken along line I-I' of FIGS. 17A through 19A, respectively.

Figure 1:
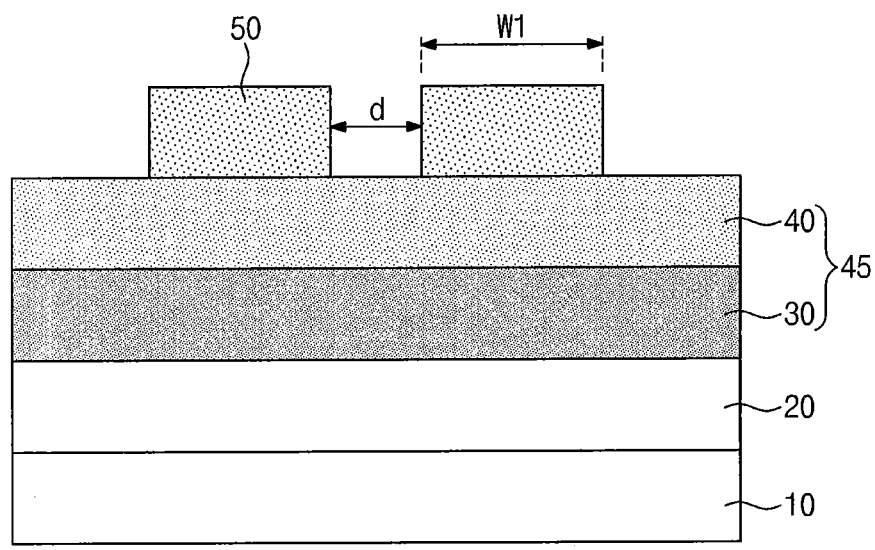
FIGS. 1 through 8 are sectional views illustrating a method of forming fine patterns, according to example embodiments of the inventive concepts.

It should be noted that these figures are intended to illustrate the general characteristics of methods, structure and/or materials utilized in certain example embodiments and to supplement the written description provided below. These drawings are not necessarily to scale and may not precisely reflect the exact structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including" specify the presence of stated operations, elements and/or components, but do not preclude the presence or addition of one or more other operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Devices according to various embodiments described herein may be embodied in microelectronic devices such as integrated circuits, where a plurality of devices are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device. The sectional and plan views provided herein may only illustrate a small portion of the array.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/ structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 8 are sectional views illustrating a method of forming fine patterns, according to example embodiments of the inventive concepts.

Referring to FIG. 1, an underlying layer 20 and a mask layer 45 are sequentially stacked on a substrate 10. The mask layer 45 may include a first mask layer 40 on the underlying layer 20 and a second mask layer 30 between the underlying layer 20 and the first mask layer 40. Sacrificial patterns 50 are formed on the mask layer 45.

The substrate 10 may include a semiconductor material. For example, the substrate 10 may be a semiconductor wafer or a structure that includes an epitaxial layer. As an example, the substrate 10 may include a single-crystalline, poly-crystalline, or amorphous layer that is made of silicon, germanium, or silicon-germanium.

The underlying layer 20 may be formed of a material having an etch selectivity with respect to the substrate 10. As an example, the underlying layer 20 may be formed of or include at least one of silicon oxide, silicon nitride, or silicon oxynitride.

The second mask layer 30 may be formed of a material having an etch selectivity with respect to the underlying layer 20. In example embodiments, the second mask layer 30 may include a polysilicon layer.

The first mask layer 40 may be formed of a material having an etch selectivity with respect to the second mask layer 3Q. As an example, the first mask layer 40 may include an amorphous carbon layer (ACL). The first mask layer 40 may further include a silicon-containing material (e.g., SiON).

The sacrificial patterns 50 may be formed using a photolithography process. The sacrificial patterns 50 may include, for example, a photoresist material or a spin-on-hardmask (SOH) material. Each of the sacrificial patterns 50 may be formed to have a first width W1, when measured in a second direction. A pair of sacrificial patterns 50 that are disposed adjacent to each other may be spaced apart from each other a distance d in the second direction, where W1>0 and d>0. A width and a pitch of the sacrificial patterns 50 may depend on a resolution of the photolithography process.

Figure 2:
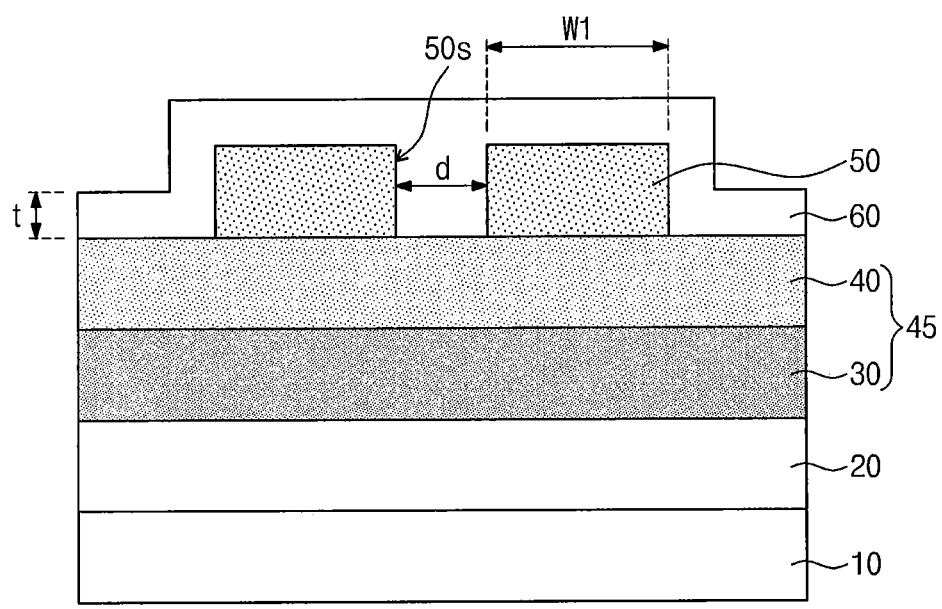

Referring to FIG. 2, a first spacer layer 60 may be formed that conformally cover the mask layer 45 and the sacrificial patterns 50. The first spacer layer 60 may include, for example, silicon oxide. The distance d between the sacrificial patterns 50 may be smaller than or substantially equal to two times a deposition thickness t of the first spacer layer 60 (i.e., d≤2t). In example embodiments, the distance d between the sacrificial patterns 50 may be one to two times the thickness t of the first spacer layer 60 (i.e., t≤d≤2t). Accordingly, the first spacer layer 60 may be formed to fill a space 50s between the pair of sacrificial patterns 50.

Figure 3:
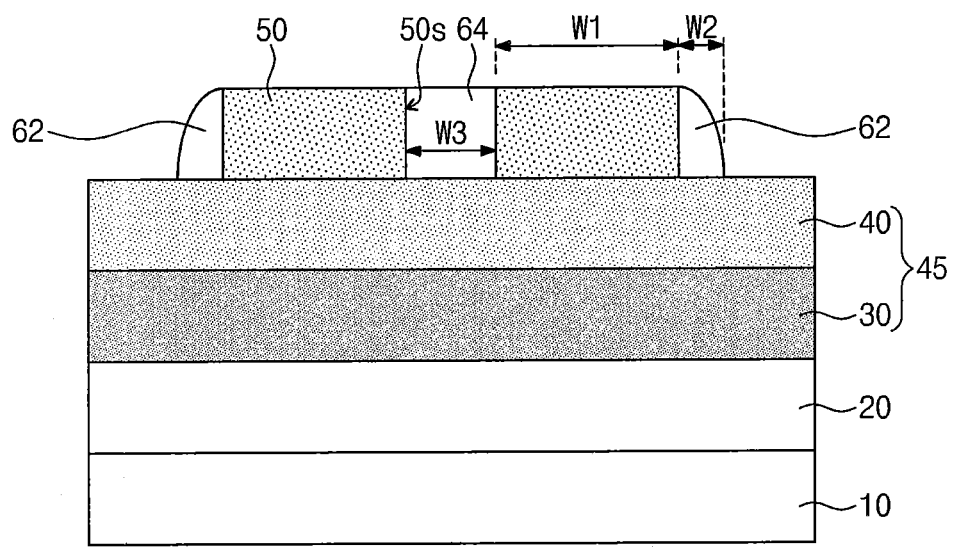

Referring to FIG. 3, the first spacer layer 60 may be anisotropically etched to form a connection spacer 64 and first spacers 62. The connection spacer 64 may be formed between the pair of the sacrificial patterns 50 to fill the space 50s, and the first spacers 62 may be formed to cover outer side surfaces of the pair of the sacrificial patterns 50. The first spacers 62 may be spaced apart from each other with the pair of sacrificial patterns 50 interposed therebetween. The anisotropic etching process may be performed to expose top surfaces of the sacrificial patterns 50 and the first mask layer 40. Each of the first spacers 62 may be locally formed on an outer side surface of a corresponding one of the sacrificial patterns 50. The connection spacer 64 may be formed to cover the opposed inner side surfaces of the sacrificial patterns 50 and the top surface of the first mask layer 40 therebetween.

By using the anisotropic etching process, each of the first spacers 62 may have a maximum width W2 that is substantially equal to the thickness t of the first spacer layer 60. The maximum width W3 of the connection spacer 64 may be substantially equal to the distance d between the sacrificial patterns 50. In other words, the maximum width W3 of the connection spacer 64 may be smaller than or substantially equal to two times the maximum width W2 of each of the first spacers 62 (i.e., W3≤2W2). In example embodiments, the maximum width W3 of the connection spacer 64 may be one to two times the maximum width W2 of each of the first spacers 62 (i.e., W2≤W3≤2W2).

Figure 4:
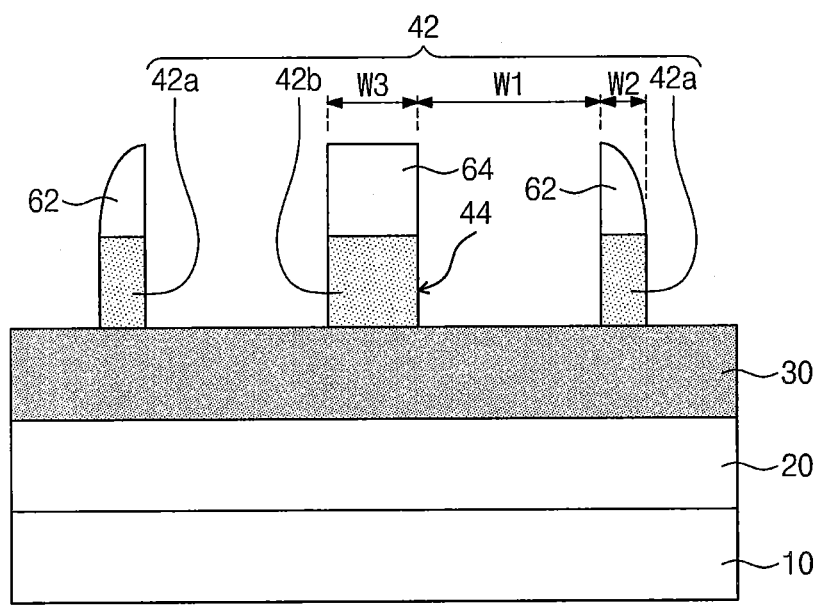

Referring to FIG. 4, the sacrificial patterns 5Q may be removed. The sacrificial patterns 50 may be removed using, for example, an ashing and/or stripping process. Thereafter, the first mask layer 40 may be etched using the first spacers 62 and the connection spacer 64 as an etch mask to form first mask patterns 42. The first mask patterns 42 may be formed to define first openings 44 that expose a top surface of the second mask layer 30 between the first mask patterns 42.

The first mask patterns 42 may include narrow-width patterns 42a and a wide-width pattern 42b. The narrow-width patterns 42a may be spaced apart from each other with the wide-width pattern 42b interposed therebetween. Each of the narrow-width patterns 42a may have a width that is proportional to the maximum width W2 of each of the first spacers 62. In example embodiments, each of the narrow-width patterns 42a may have substantially the same width as the maximum width W2 of each of the first spacers 62. The wide-width pattern 42b may have a width that is proportional to the maximum width W3 of the connection spacer 64. In example embodiments, the wide-width pattern 42b may have substantially the same width as the maximum width W3 of the connection spacer 64. Each of the first openings 44 may have a width that is proportional to the first width W1 of each of the sacrificial patterns 50. In example embodiments, each of the first openings 44 may have substantially the same width as the first width W1 of each of the sacrificial patterns 50.

Figure 5:
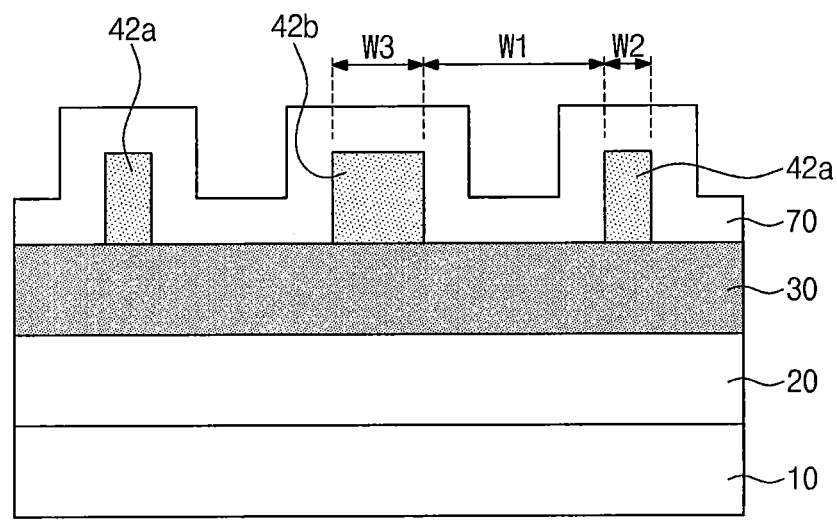

Referring to FIG. 5, the first spacers 62 and the connection spacer 64 may be removed. The first spacers 62 and the connection spacer 64 may be removed using an etch recipe having an etch selectivity with respect to the first mask patterns 42 and the second mask layer 30. The removal of the first spacers 62 and the connection spacer 64 may be performed using, for example, a wet etching process. Thereafter, a second spacer layer 70 may be formed on the second mask layer 30 to conformally cover the first mask patterns 42. The second spacer layer 70 may be formed of or include, for example, silicon oxide.

Figure 6:
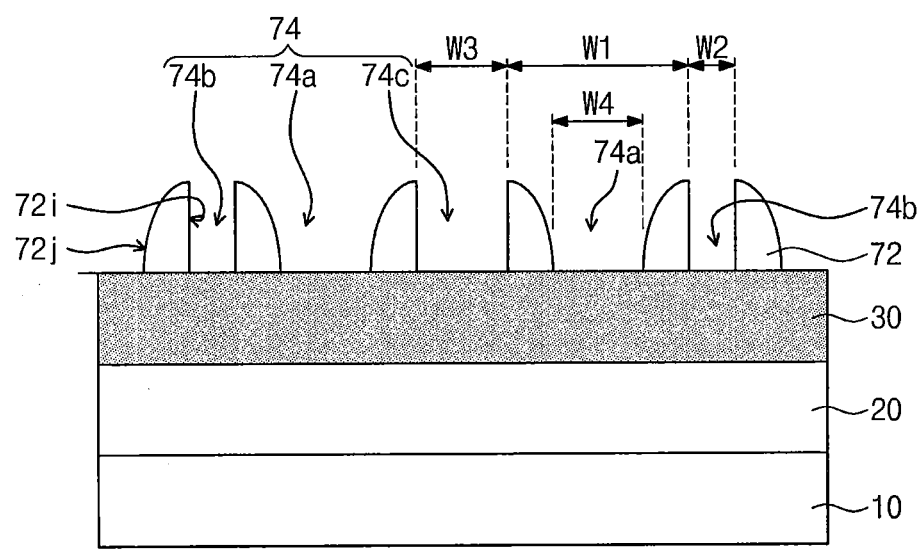

Referring to FIG. 6, the second spacer layer 70 may be anisotropically etched to form second spacers 72 that cover side surfaces of the first mask patterns 42. The anisotropic etching process may expose top surfaces of the first mask patterns 42 and the second mask layer 30. As a result of the anisotropic etching process, the second spacers 72 may be locally formed on the side surfaces of the first mask patterns 42, respectively. Each of the second spacers 72 may have a first side surface 72i that is in contact with the first mask pattern 42 and a second side surface 72j that is opposite to the first side surface 72i.

Thereafter, the first mask patterns 42 may be removed. The first mask patterns 42 may be removed using an etch recipe having an etch selectivity with respect to the second spacers 72 and the second mask layer 30. The first mask patterns 42 may be removed using, for example, a wet etching process.

As a result of the removal of the first mask patterns 42, preliminary openings 74 may be formed that expose the second mask layer 30 between the second spacers 72. The preliminary openings 74 may include a first preliminary opening 74a, a second preliminary opening 74b, and a third preliminary opening 74c, which are spaced apart from each other in the second direction. The first preliminary opening 74a may be between the second and third preliminary openings 74b and 74c.

The first preliminary opening 74a may be defined by the second side surfaces 72j of an adjacent pair of the second spacers 72 and the top surface of the second mask layer 30 therebetween. Each second preliminary opening 74b may be defined by the first side surfaces 72i of an adjacent pair of the second spacers 72, which were formed on the side surfaces of one of the narrow-width patterns 42a, and by the top surface of the second mask layer 30 therebetween. The third preliminary opening 74c may be defined by the first side surfaces 72i of an adjacent pair of the second spacers 72, which were formed on the side surfaces of the wide-width pattern 42b, and by the top surface of the second mask layer 30 therebetween. Accordingly, the second preliminary opening 74b may have a width that is proportional to the maximum width W2 of the first spacer 62, and the third preliminary opening 74c may have a width that is proportional to the maximum width W3 of the connection spacer 64. In example embodiments, the second preliminary opening 74b may have substantially the same width as the maximum width W2 of the first spacer 62, and the third preliminary opening 74c may have substantially the same width as the maximum width W3 of the connection spacer 64. The first preliminary opening 74a may have a minimum width W4, which may be proportional to the first width W1 of the sacrificial pattern 50. The minimum width W4 of the first preliminary opening 74a may be smaller than the first width W1 of the sacrificial pattern 50 (i.e., W4<W1).

Figure 7:
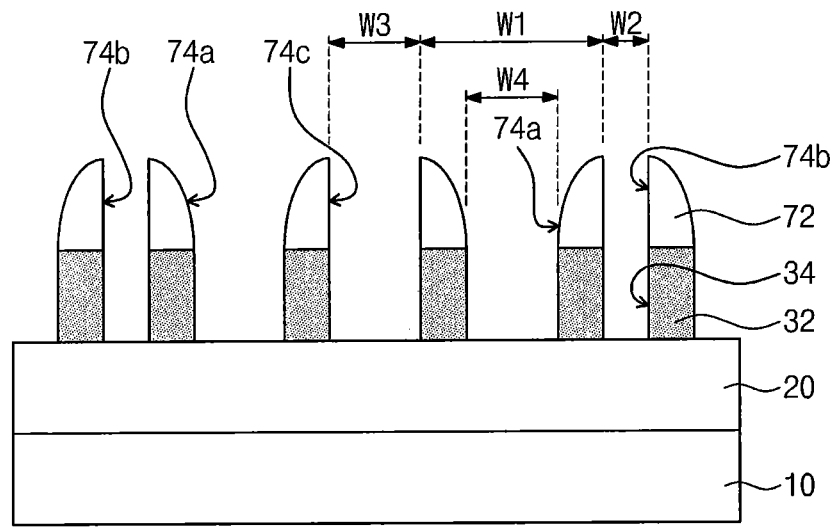

Referring to FIG. 7, the second mask layer 30 may be etched using the second spacers 72 as an etch mask to form second mask patterns 32. The second mask patterns 32 may define second openings 34 that expose the top surface of the underlying layer 20 therebetween. A width of each of the second openings 34 may be proportional to that of a corresponding one of the preliminary openings 74. In example embodiments, each of the second openings 34 may have substantially the same width as a corresponding one of the preliminary openings 74.

Figure 8:
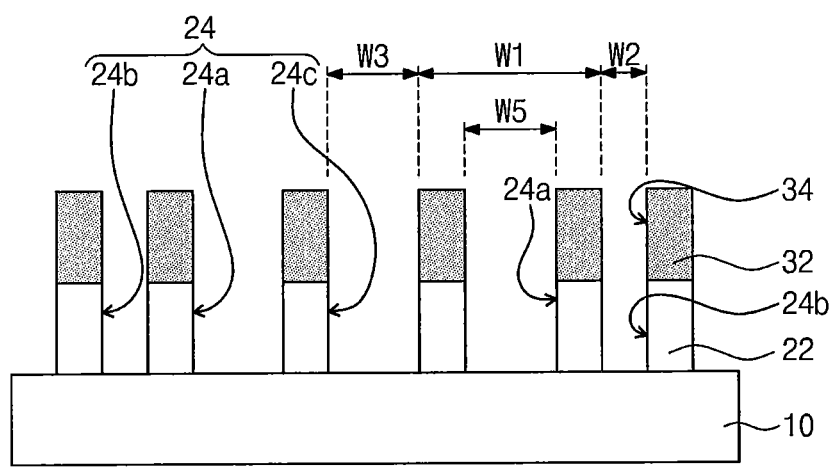

Referring to FIG. 8, the second spacers 72 may be removed. The removal of the second spacers 72 may be performed using an etch recipe having an etch selectivity with respect to the second mask patterns 32 and the underlying layer 20. As an example, the removal of the second spacers 72 may be performed using, for example, a wet etching process.

The underlying layer 20 may be etched using the second mask patterns 32 as an etch mask to form lower mask patterns 22. The lower mask patterns 22 may define lower openings 24 that expose the top surface of the substrate 10 therebetween.

A width of each of the lower openings 24 may be proportional to that of a corresponding one of the second openings 34. In example embodiments, each of the lower openings 24 may have substantially the same width as that of a corresponding one of the second openings 34.

The lower openings 24 may include a first lower opening 24a, a second lower opening 24b, and a third lower opening 24c, which are spaced apart from each other in the second direction. The first lower opening 24a may be between the second and third lower openings 24b and 24c.

The second lower opening 24b may have a width that is proportional to the maximum width W2 of the first spacer 62, and the third lower opening 24c may have a width that is proportional to the maximum width W3 of the connection spacer 64. In example embodiments, the second lower opening 24b may have substantially the same width as the maximum width W2 of the first spacer 62, and the third lower opening 24c may have substantially the same width as the maximum width W3 of the connection spacer 64. The first lower opening 24a may have a second width W5, which may be proportional to the first width W1 of the sacrificial pattern 50. The second width W5 of the first lower opening 24a may be smaller than the first width W1 of the sacrificial pattern 50 (i.e., W5<W1). In example embodiments, the second width W5 of the first lower opening 24a may be substantially equal to the minimum width W4 of the first preliminary opening 74a.

In example embodiments, the widths of the first, second, and third lower openings 24a, 24b, and 24c may be proportional to the first width W1 of the sacrificial pattern 50, the maximum width W2 of the first spacer 62, and the maximum width W3 of the connection spacer 64, respectively. The maximum width W2 of the first spacer 62 may be controlled by the thickness t of the first spacer layer 60, and the maximum width W3 of the connection spacer 64 may be controlled by the distance d between the pair of the sacrificial patterns 50. In other words, the first width W1 of the sacrificial pattern 50, the thickness t of the first spacer layer 60, and the distance d between the pair of the sacrificial patterns 50 may be used to control the widths of the first to third lower openings 24a, 24b, and 24c, respectively. This means that the above-described fine patterning method can be used to realize a variety of pitches of successively-arranged patterns.

FIGS. 9A through 16A are plan views illustrating a method of fabricating a semiconductor device using a fine-patterning method according to example embodiments of the inventive concepts. FIGS. 9B through 16B are sectional views taken along line I-I' of FIGS. 9A through 16A, respectively.

Figure 9A:
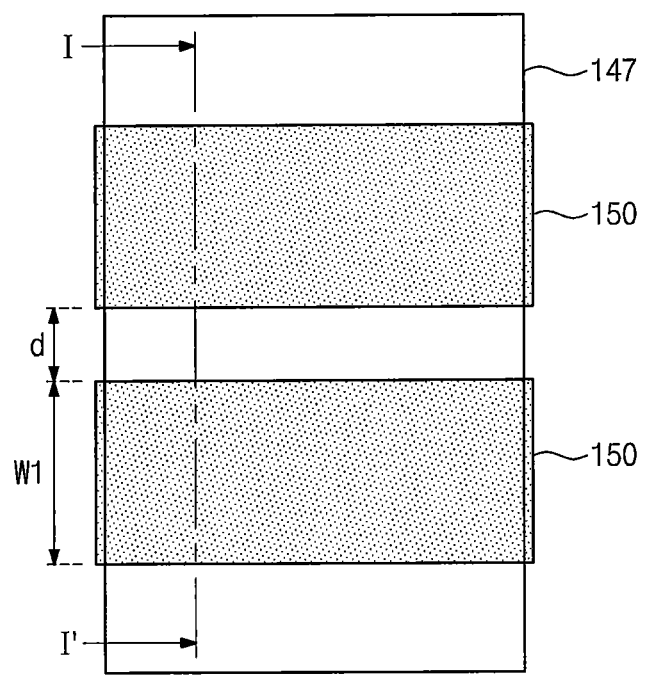
Figure 9A:
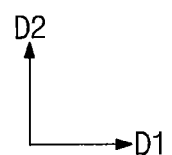
Figure 9B:
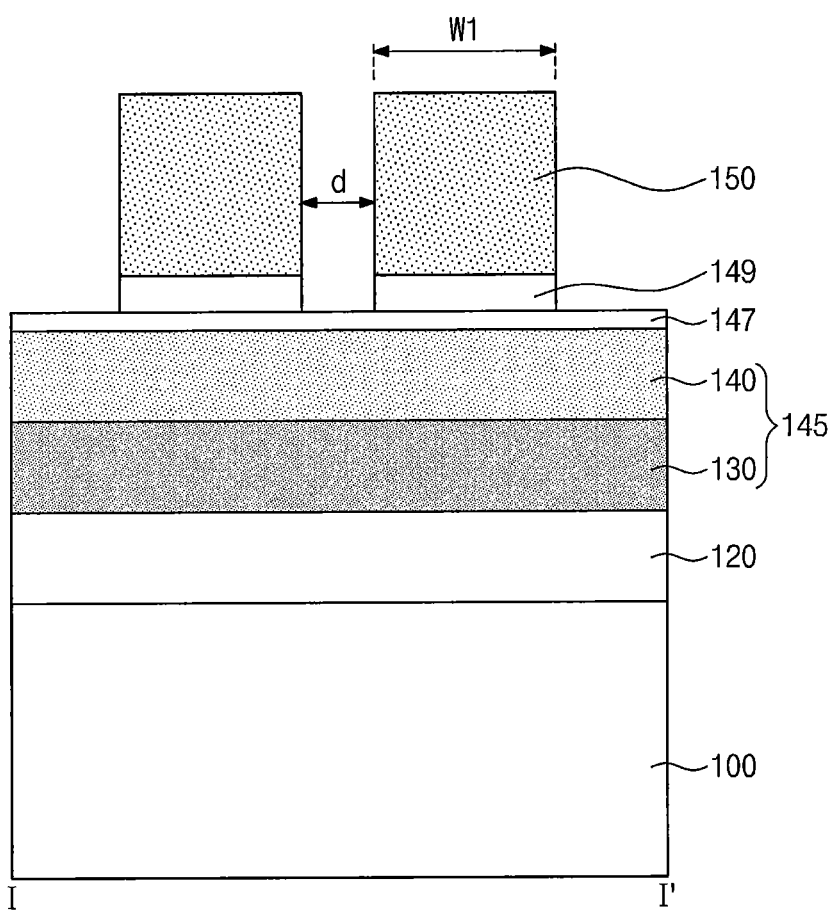

Referring to FIGS. 9A and 9B, an underlying layer 120 and a mask layer 145 may be sequentially formed on a substrate 100. The mask layer 145 may include a first mask layer 140 on the underlying layer 120 and a second mask layer 130 between the underlying layer 120 and the first mask layer 140. An etch stop layer 147 may be formed on the mask layer 145.

The substrate 10 may include a semiconductor material. For example, the substrate 10 may be a semiconductor wafer or a structure that includes an epitaxial layer. As an example, the substrate 10 may include a single-crystalline, poly-crystalline, or amorphous layer that is made of silicon, germanium, or silicon-germanium. The underlying layer 20 may be formed of a material having an etch selectivity with respect to the substrate 10. As an example, the underlying layer 20 may be formed of or include at least one of silicon oxide, silicon nitride, or silicon oxynitride. The second mask layer 30 may be formed of a material having an etch selectivity with respect to the underlying layer 20. As an example, the second mask layer 30 may be formed of or include poly silicon. The first mask layer 40 may be formed of a material having an etch selectivity with respect to the second mask layer 30. As an example, the first mask layer 40 may be formed of or include an amorphous carbon layer (ACL). The etch stop layer 147 may be formed of or include, for example, silicon oxynitride (SiON).

Sacrificial patterns 150 may be formed on the etch stop layer 147. Each sacrificial pattern 150 may be a line-shaped pattern that extends in a first direction D1. The sacrificial patterns 150 may be arranged along a second direction D2 that crosses the first direction D1. The second direction D2 may be perpendicular to the first direction D1. Each of the sacrificial patterns 150 may be formed to have a first width W1, when measured in the second direction D2. A pair of sacrificial patterns 150 may be spaced apart from each other in the second direction D2 by a distance d (where W1>0 and d>0).

The sacrificial patterns 150 may be formed using a photolithography process. As an example, the sacrificial patterns 150 may include, for example, a photoresist material or a spin-on-hardmask (SOH) material. A width and a pitch of the sacrificial pattern 150 may depend on a resolution capability of the photolithography process.

An anti-reflection pattern 149 may be formed below each sacrificial pattern 150. The anti-reflection patterns 149 may be formed of, for example, an organic anti-reflective coating (ARC) layer.

Figure 10A:
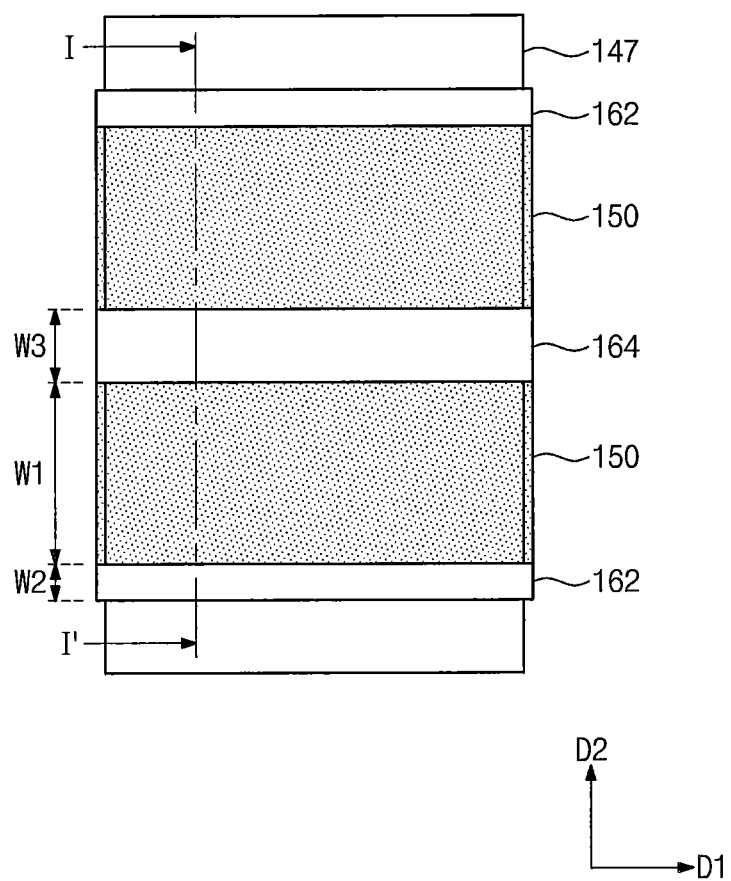
Figure 10B:
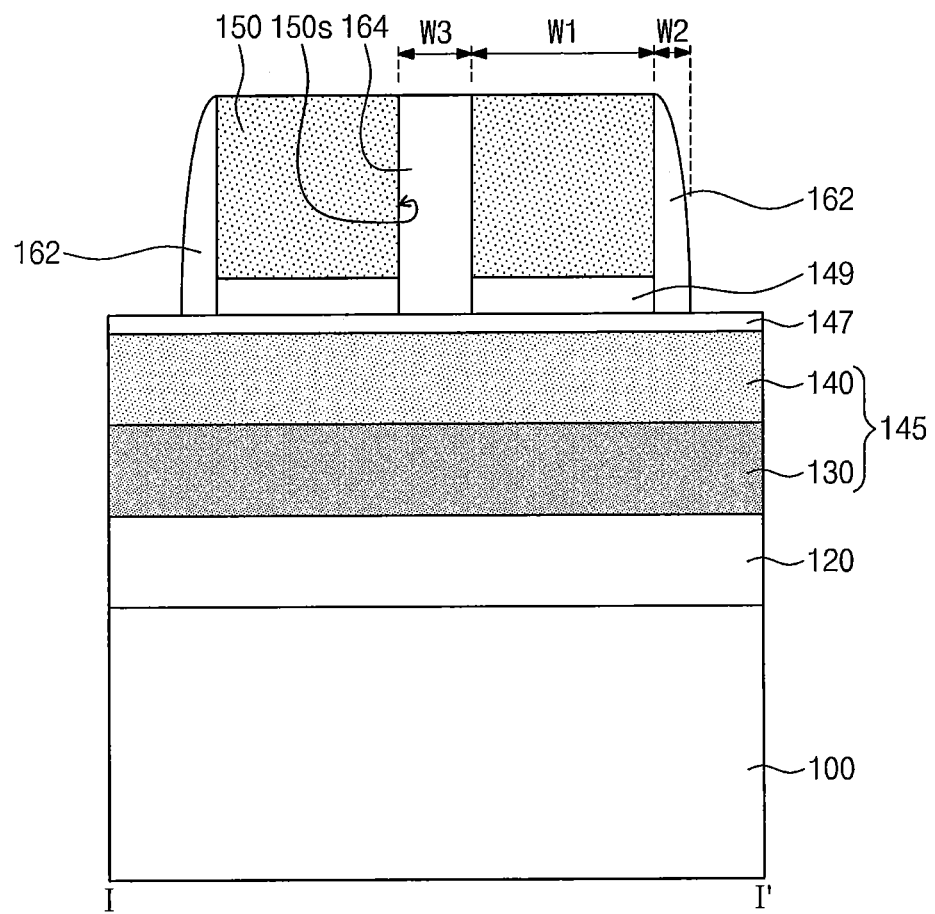

Referring to FIGS. 10A and 10B, a connection spacer 164 may be formed to fill a space 150s between the pair of sacrificial patterns 150, and first spacers 162 may be formed to cover opposite outer side surfaces of the pair of sacrificial patterns 150. The connection spacer 164 and the first spacers 162 may be formed by forming a first spacer layer (not shown) on the etch stop layer 147 to conformally cover the sacrificial patterns 150, and then, anisotropically etching the first spacer layer. The connection spacer 164 and the first spacers 162 may be formed using the fine patterning method previously described with reference to FIGS. 2 and 3.

As a result of the anisotropic etching process, the maximum width W2 of each of the first spacers 162 may be substantially equal to a thickness t of the first spacer layer, as described above with reference to FIGS. 2 and 3. The maximum width W3 of the connection spacer 164 may be substantially equal to the distance d between the sacrificial patterns 50. The maximum width W3 of the connection spacer 164 may be smaller than or substantially equal to two times the maximum width W2 of each of the first spacers 162 (i.e., W3≤2W2). In example embodiments, the maximum width W3 of the connection spacer 164 may be one to two times the maximum width W2 of each of the first spacers 162 (i.e., W2≤W3≤2W2).

Figure 11A:
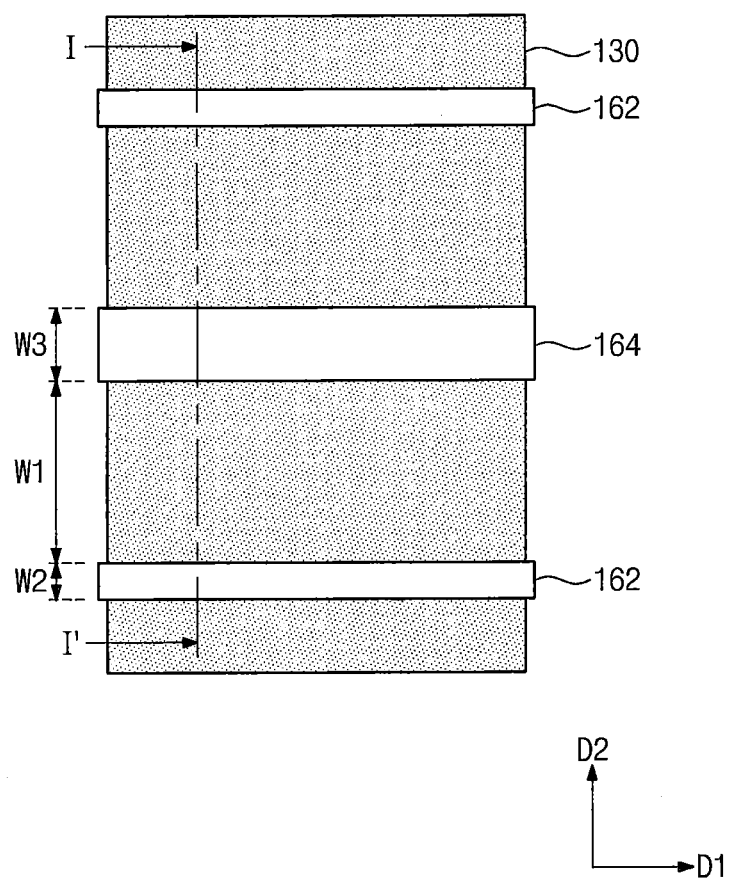
Figure 11B:
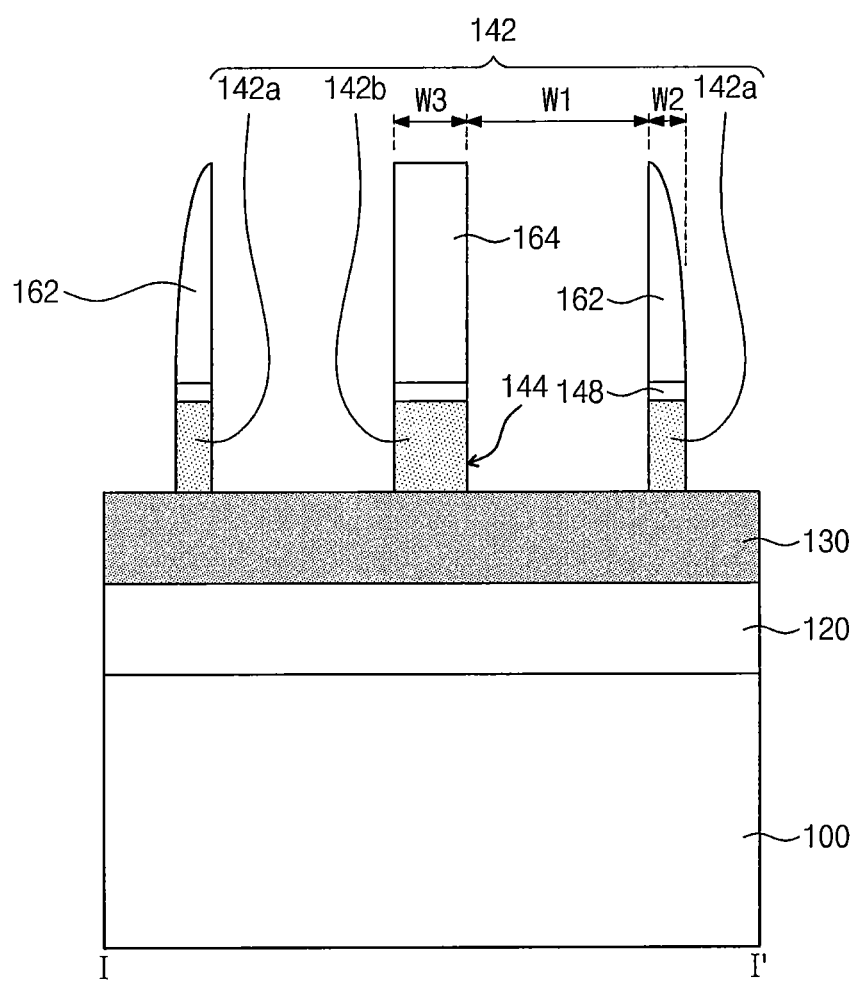

Referring to FIGS. 11A and 11B, the sacrificial patterns 150 and the anti-reflection patterns 149 may be removed. The removal of the sacrificial patterns 150 and the anti-reflection patterns 149 may be performed using, for example, an ashing and/or stripping process. Thereafter, the etch stop layer 147 and the first mask layer 140 may be etched using the first spacers 162 and the connection spacer 164 as an etch mask to form etch stop patterns 148 and first mask patterns 142. The first mask patterns 142 may define first openings 144 that expose the top surface of the second mask layer 130 therebetween.

The first mask patterns 142 may include narrow-width patterns 142a and a wide-width pattern 142b. The narrow-width patterns 142a may be spaced apart from each other with the wide-width pattern 142b interposed therebetween. Each of the narrow-width patterns 142a may have a width that is proportional to the maximum width W2 of each of the first spacers 162. In example embodiments, each of the narrow-width patterns 142a may have substantially the same width as the maximum width W2 of each of the first spacers 162. The wide-width pattern 142b may have a width that is proportional to the maximum width W3 of the connection spacer 164. In example embodiments, the wide-width pattern 142b may have substantially the same width as the maximum width W3 of the connection spacer 164. Each of the first openings 144 may have a width that is proportional to the first width W1 of each of the sacrificial patterns 150. In example embodiments, each of the first openings 144 may have substantially the same width as the first width W1 of each of the sacrificial patterns 150.

The etch stop patterns 148 may be interposed between the first spacers 162 and the narrow-width patterns 142a and between the connection spacer 164 and the wide-width pattern 142b.

Figure 12A:
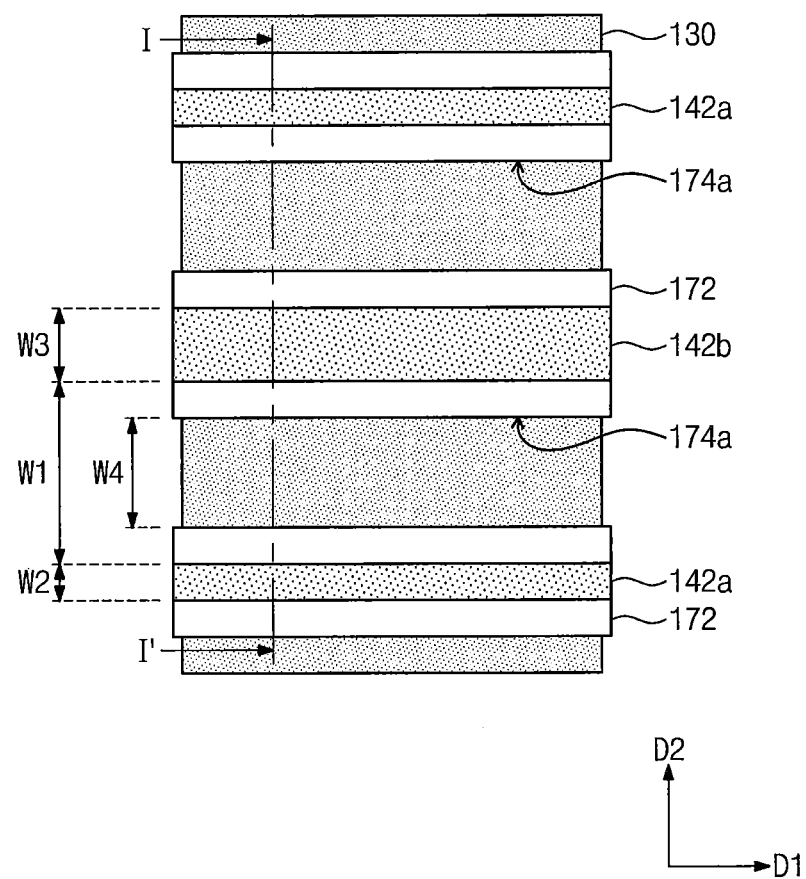
Figure 12B:
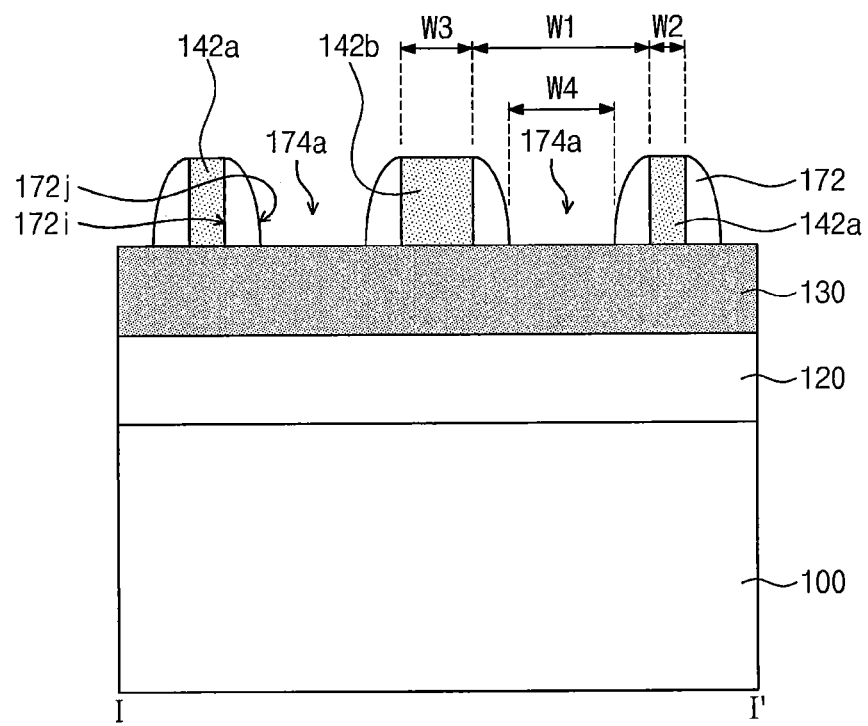

Referring to FIGS. 12A and 12B, the first spacers 162, the connection spacer 164, and the etch stop patterns 148 may be removed. The first spacers 162, the connection spacer 164, and the etch stop patterns 148 may be removed using an etch recipe having an etch selectivity with respect to the first mask patterns 142 and the second mask layer 130.

Thereafter, second spacers 172 may be formed to cover side surfaces of the first mask patterns 142. The second spacers 172 may be formed by forming a second spacer layer (not shown) on the second mask layer 130 to conformally cover the first mask patterns 142 and then anisotropically etching the second spacer layer. The second spacers 172 may be formed using the fine patterning method described above with reference to FIGS. 5 and 6. Each of the second spacers 172 may have a first side surface 172i that contacts the first mask pattern 142 and a second side surface 172j opposite the first side surface 172i.

As a result of the anisotropic etching process, a first preliminary opening 174a may be formed that exposes the top surface of the second mask layer 130 between the second spacers 172. The first preliminary opening 174a may be defined by the second side surfaces 172j of adjacent ones of the second spacers 172 and the top surface of the second mask layer 130 therebetween. The first preliminary opening 174a may have a minimum width W4 that is proportional to the first width W1 of the sacrificial pattern 150. The minimum width W4 of the first preliminary opening 174a may be smaller than the first width W1 of the sacrificial pattern 150.

Figure 13A:
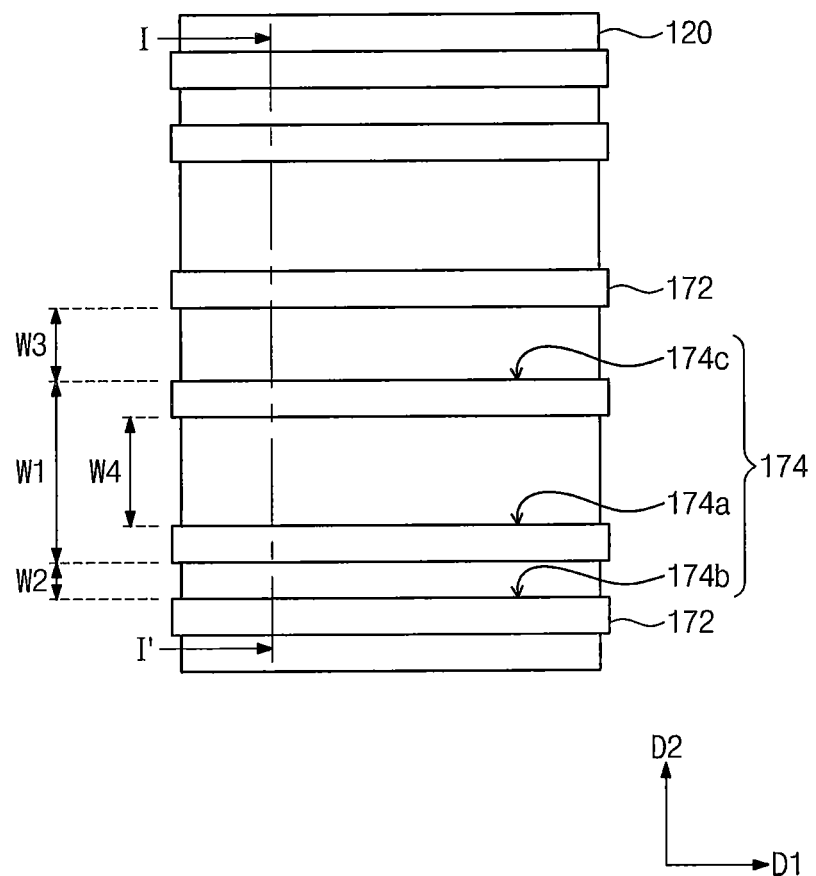
Figure 13B:
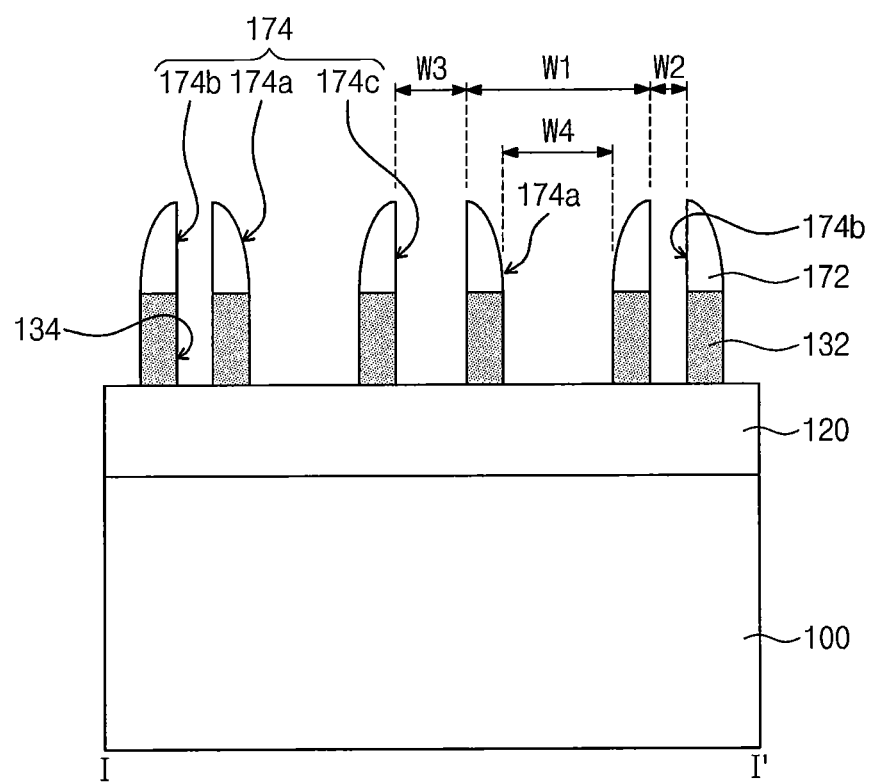

Referring to FIGS. 13A and 13B, the first mask patterns 142 may be removed. The first mask patterns 142 may be removed using an etch recipe having an etch selectivity with respect to the second spacers 172 and the second mask layer 130. As a result of the removal of the first mask patterns 142, a second preliminary opening 174b and a third preliminary opening 174c may be formed between the second spacers 172 that expose the top surface of the second mask layer 130. The second preliminary opening 174b may be defined by the first side surfaces 172i of a pair of the second spacers 172, which were formed on both sides of the narrow-width pattern 142a and by the top surface of the second mask layer 130 therebetween. The third preliminary opening 174c may be defined by the first side surfaces 172i of a pair of the second spacers 172, which were formed on both sides of the wide-width pattern 142b and by the top surface of the second mask layer 130 therebetween.

The first, second, and third preliminary openings 174a, 174b, and 174c may be formed along the second direction D2. The first preliminary opening 174a may be positioned between the second and third preliminary openings 174b and 174c. The second preliminary opening 174b may have a width that is proportional to the maximum width W2 of the first spacer 162, and the third preliminary opening 174c may have a width that is proportional to the maximum width W3 of the connection spacer 164. In example embodiments, the second preliminary opening 174b may have substantially the same width as the maximum width W2 of the first spacer 162, and the third preliminary opening 174c may have substantially the same width as the maximum width W3 of the connection spacer 164. The first, second, and third preliminary openings 174a, 174b, and 174c may constitute preliminary openings 174 that are defined by the second spacers 172.

The second mask layer 130 may be etched using the second spacers 172 as an etch mask to form second mask patterns 132. The second mask patterns 132 may be formed to define second openings 134 that expose the top surface of the underlying layer 120 therebetween. A width of each of the second openings 134 may be proportional to that of a corresponding one of the preliminary openings 174. In example embodiments, each of the second openings 134 may have substantially the same width as that of a corresponding one of the preliminary openings 174.

Figure 14A:
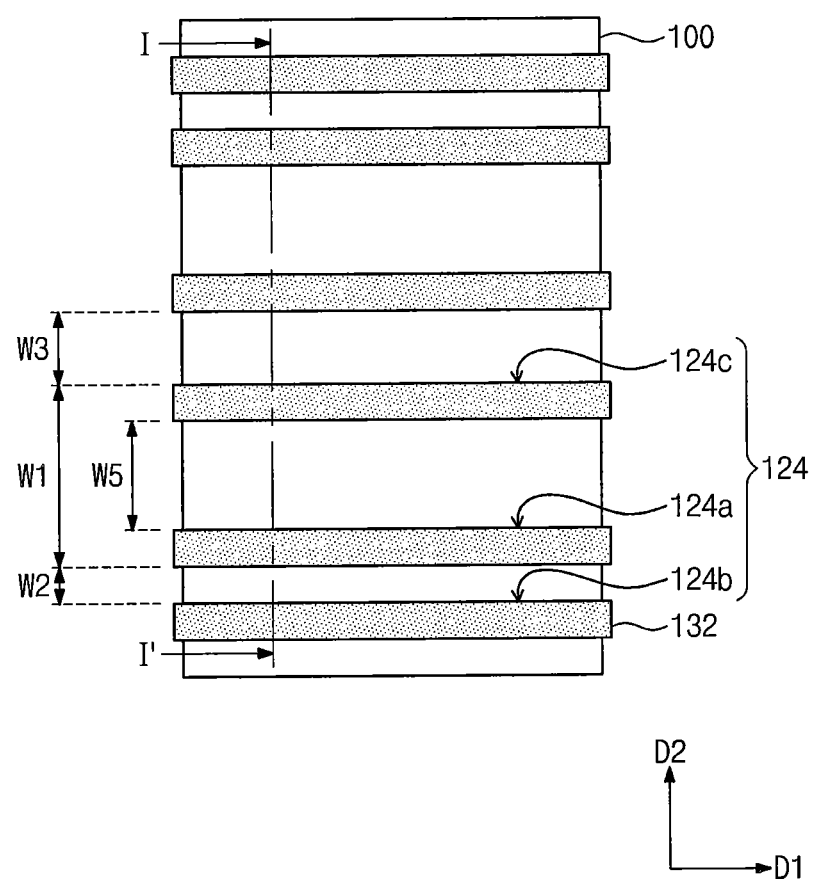
Figure 14B:
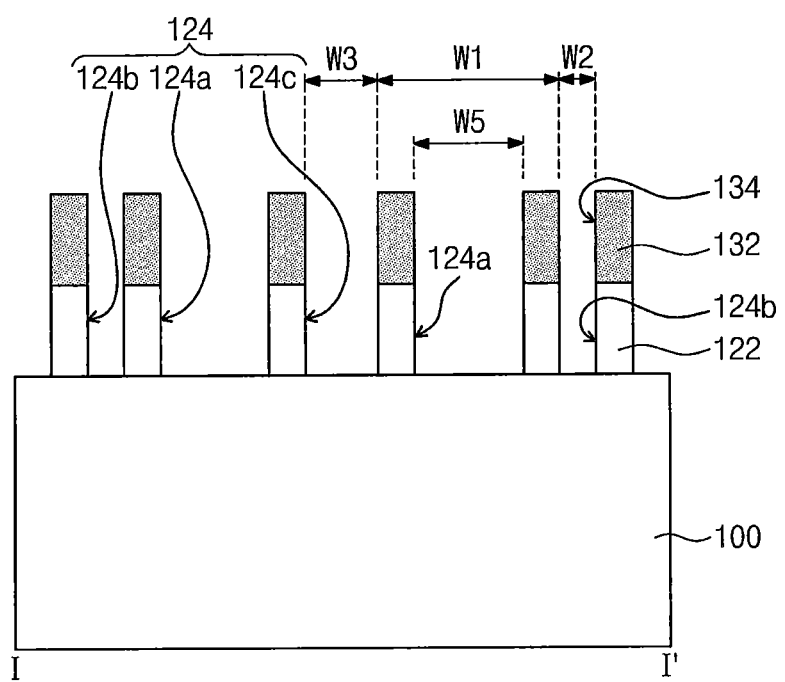

Referring to FIGS. 14A and 14B, the second spacers 172 may be removed. The second spacers 172 may be removed using an etch recipe having an etch selectivity with respect to the second mask patterns 132 and the underlying layer 120.

The underlying layer 120 may be etched using the second mask patterns 132 as an etch mask to form lower mask patterns 122. The lower mask patterns 122 may define lower openings 124 that expose the top surface of the substrate 100 therebetween.

The lower openings 124 may include a first lower opening 124a, a second lower opening 124b, and a third lower opening 124c, which are spaced apart from each other in the second direction. The first lower opening 124a may be formed between the second and third lower openings 124b and 124c.

The second lower opening 124b may have a width that is proportional to the maximum width W2 of the first spacer 162, and the third lower opening 124c may have a width that is proportional to the maximum width W3 of the connection spacer 164. In example embodiments, the second lower opening 124b may have substantially the same width as the maximum width W2 of the first spacer 162, and the third lower opening 124c may have substantially the same width as the maximum width W3 of the connection spacer 164. The first lower opening 124a may have a second width W5 that is proportional to the first width W1 of the sacrificial pattern 150. The second width W5 of the first lower opening 124a may be smaller than the first width W1 of the sacrificial patterns 150. In example embodiments, the second width W5 of the first lower opening 124a may be substantially equal to the minimum width W4 of the first preliminary opening 174a.

Figure 15A:
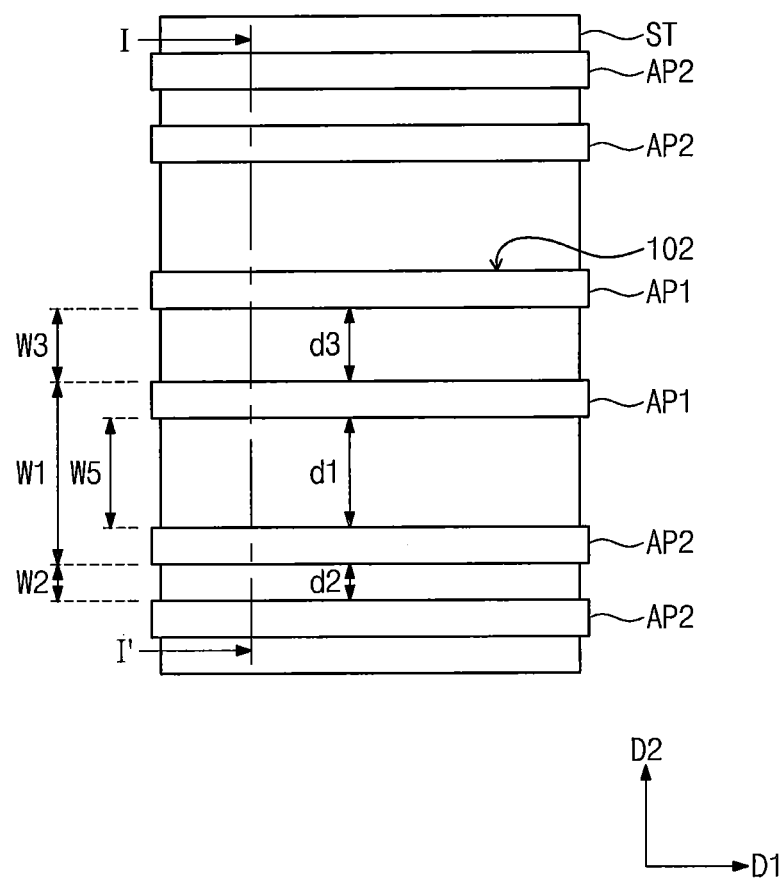
Figure 15B:
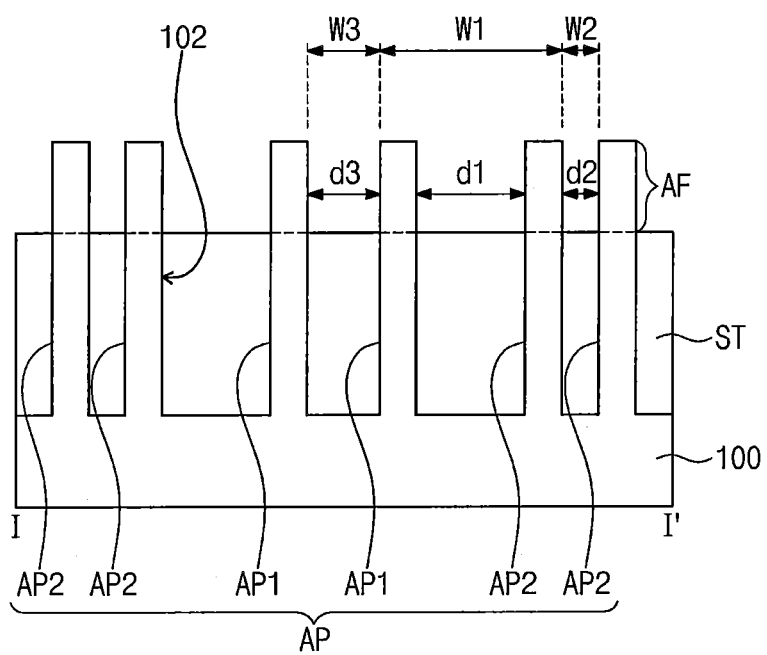

Referring to FIGS. 15A and 15B, an upper portion of the substrate 100 may be etched using the second mask patterns 132 and the lower mask patterns 122 as an etch mask to form trenches 102 and active patterns AP that are defined by the trenches 102. In certain embodiments, at least a portion of the second mask patterns 132 may be removed during the etching process.

The active patterns AP may be line-shaped patterns that extend in the first direction D1 that are spaced apart from each other in the second direction D2. When viewed in a sectional view, upper portions of each of the active patterns AP may protrude upward from the top surface of the substrate 100.

Thereafter, device isolation patterns ST may be formed in the trenches 102, respectively. As an example, the device isolation patterns ST may be formed by forming a device isolation layer (not shown) on the substrate 100 to fill the trenches 102 and then planarizing the device isolation layer to expose the substrate 100. In certain embodiments, the lower mask patterns 122 may be removed during the planarization process. Upper portions of the device isolation patterns ST may be vertically recessed to expose upper portions of the active patterns AP. The exposed upper portions of the active patterns AP may serve as active fins AF.

The active patterns AP may include active patterns AP1 (hereinafter, first active patterns) having a first conductivity type and active patterns AP2 (hereinafter, second active patterns) having a second conductivity type. The first conductivity type may be different from or opposite to the second conductivity type. The conductivity types of the first and second active patterns AP1 and AP2 may be achieved by performing an ion implantation process on the substrate 100, but example embodiments of the inventive concepts are not limited thereto.

In example embodiments, a pair of the first active patterns AP1 and two pairs of the second active patterns AP2 may be provided on the substrate 100. One pair of the second active patterns AP2 may be spaced apart from another pair the second active patterns AP2, and the pair of the first active patterns AP1 may be interposed therebetween.

A first distance d1 between a first active pattern AP1 and an adjacent second active pattern AP2 may be proportional to the first width W1 of the sacrificial pattern 150. The first distance d1 may be smaller than the first width W1 of the sacrificial pattern 150. In example embodiments, the first distance d1 may be substantially equal to the second width W5 of the first lower opening 124a. A second distance d2 between the second active patterns AP2 of each pair of second active patterns AP2 may be proportional to the maximum width W2 of the first spacer 162. In example embodiments, the second distance d2 may be substantially equal to the maximum width W2 of the first spacer 162. A third distance d3 between the first active patterns AP1 of the pair of first active patterns AP1 may be proportional to the maximum width W3 of the connection spacer 164. In example embodiments, the third distance d3 may be substantially equal to the maximum width W3 of the connection spacer 164.

In example embodiments, the first, second, and third distances d1, d2, and d3 may be proportional to the first width W1 of the sacrificial pattern 150, the maximum width W2 of the first spacer 162, and the maximum width W3 of the connection spacer 164, respectively. As described with reference to FIGS. 2 and 3, the maximum width W2 of the first spacer 162 may be controlled by the thickness t of the first spacer layer, and the maximum width W3 of the connection spacer 164 may be controlled by the distance d between the pair of sacrificial patterns 150. In other words, the first width W1 of the sacrificial pattern 150, the thickness t of the first spacer layer, and the distance d between the pair of sacrificial patterns 150 may be used to control the respective first to third distances d1, d2, and d3. Accordingly, the above-described fine patterning method can be used to allow a variety of pitches of the active patterns AP which are successively-arranged.

Figure 16A:
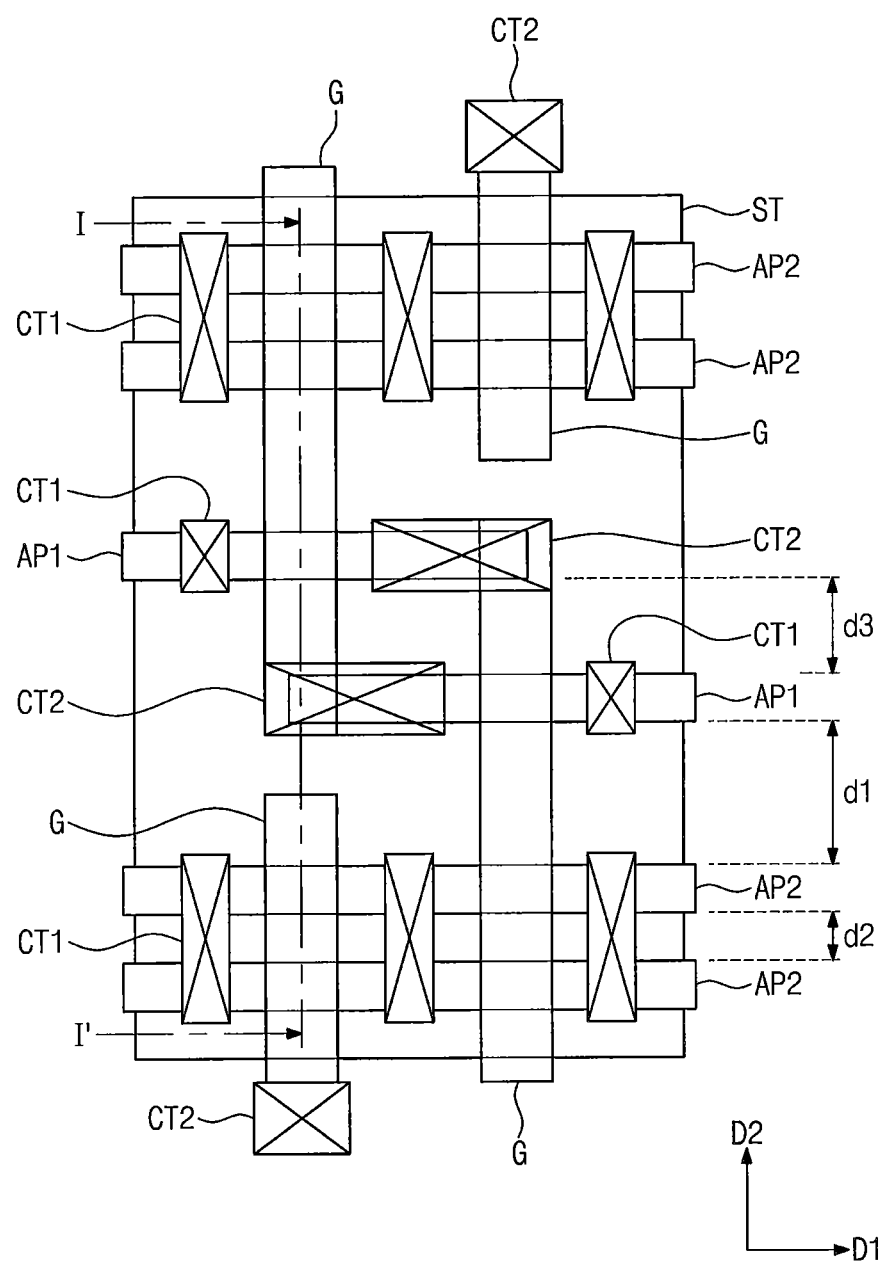
Figure 16B:
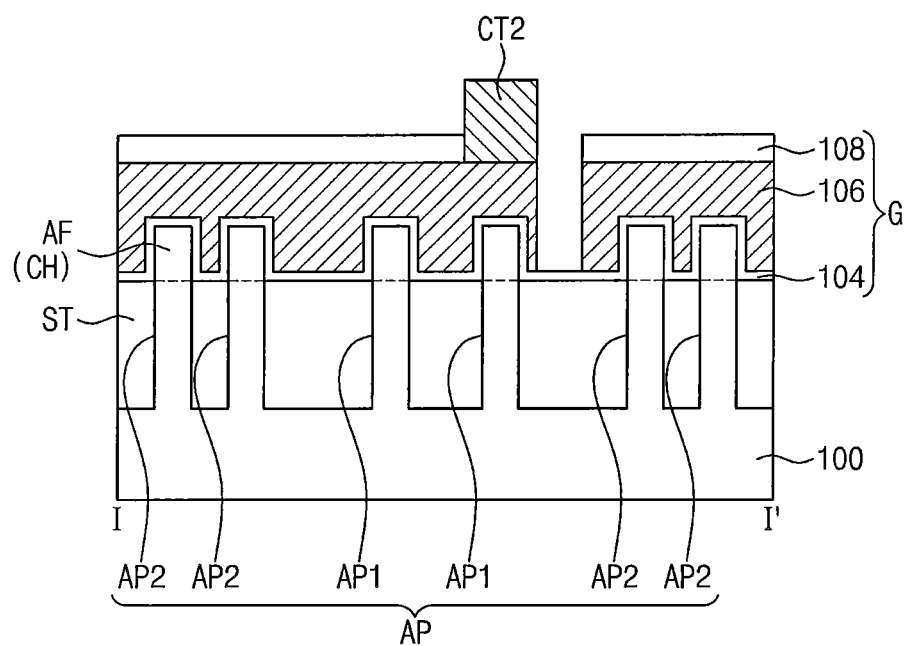

Referring to FIGS. 16A and 16B, gate structures G may be formed on the substrate 100 to cross the active patterns AP. Each of the gate structures G may include a gate dielectric pattern 104, a gate electrode 106, and a capping pattern 108, which are sequentially stacked on the substrate 100. The gate structure G may be formed by patterning a gate dielectric layer, a gate electrode layer, and a capping layer that are sequentially stacked on the substrate 100. The gate dielectric pattern 104 may be formed of or include at least one of a silicon oxide layer, a silicon oxynitride layer, or high-k dielectric materials, whose dielectric constants are higher than that of silicon oxide. The gate electrode 106 may include at least one of doped semiconductors, metals, or conductive metal nitrides. The capping pattern 108 may include at least one of a silicon oxide layer, a silicon nitride layer, or a silicon oxynitride layer. Although not shown, gate spacers may be formed on both side surfaces of each of the gate structures G. In example embodiments, a portion of the first active pattern AP1 may be removed before the formation of the gate structures G. For example, when measured in the first direction D1, a length of the first active pattern AP1 may be smaller than that of the second active pattern AP2.

Source/drain regions may be formed in or on portions of the active patterns AP, which are positioned at both sides of each gate structure G. Other portions of the active fins AF positioned below the gate structures G may serve as channel regions of transistors. Thereafter, first and second contacts CT1 and CT2 may be formed. The first contacts CT1 may be used to apply source/drain voltages to the source/drain regions, and the second contacts CT2 may be used to apply gate voltages to the gate electrodes 106.

FIGS. 17A through 19A are plan views illustrating another method of fabricating a semiconductor device using a fine-patterning method according to example embodiments of the inventive concepts. FIGS. 17B through 19B are sectional views taken along line I-I' of FIGS. 17A through 19A, respectively. For concise description, an element or a step previously described with reference to FIGS. 9A through 16A and 9B through 16B may be identified by a similar or identical reference number without repeating the description thereof.

Firstly, stacks of the lower mask patterns 122 and the second mask patterns 132 may be formed on the substrate 100, as described with reference to FIGS. 9A through 14A and 9B through 14B.

Figure 17A:
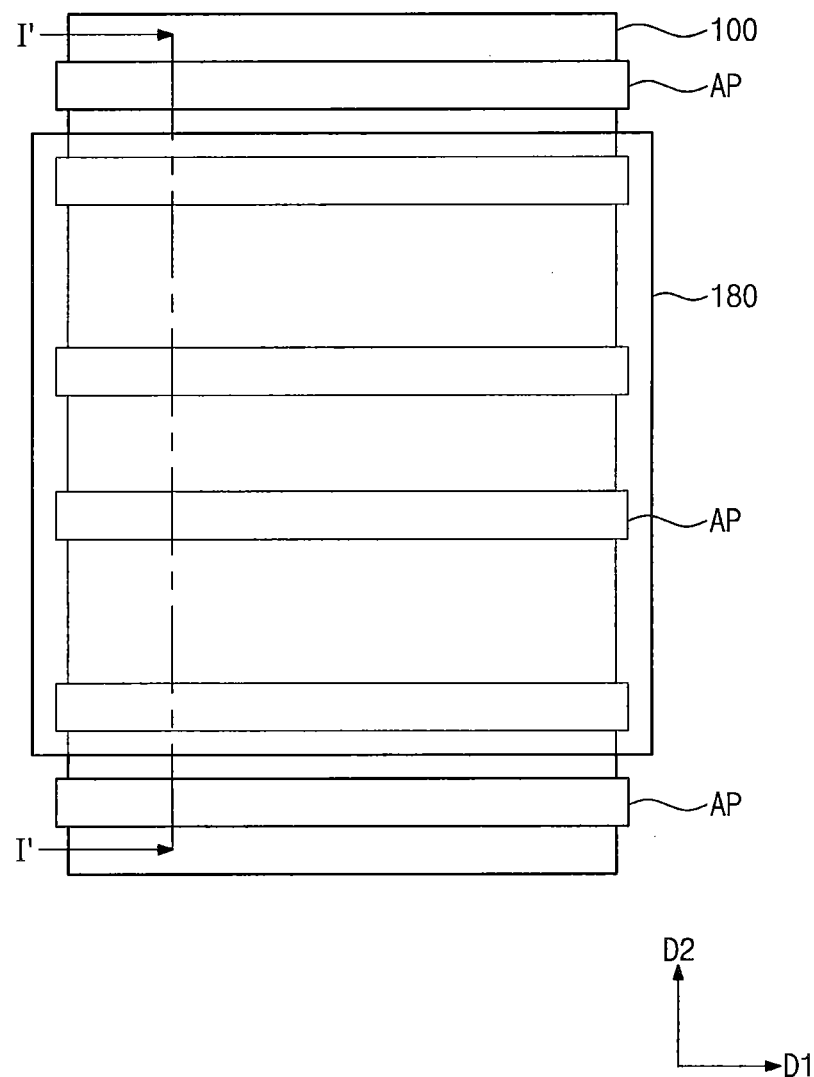
Figure 17B:
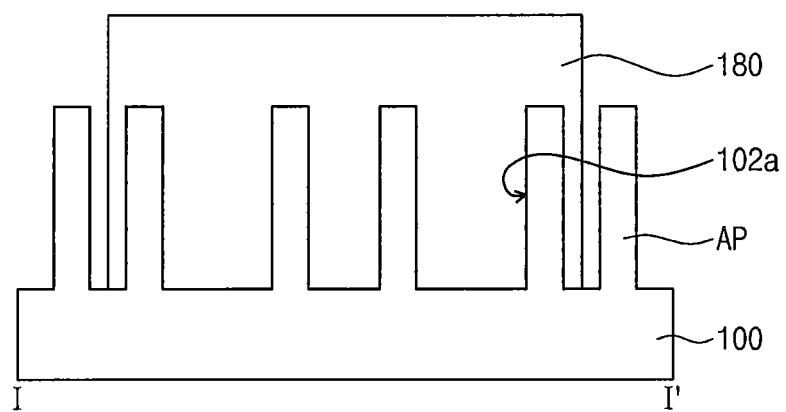

Referring to FIGS. 17A and 17B, the upper portion of the substrate 100 may be etched using the second mask patterns 132 and the lower mask patterns 122 as an etch mask to form first trenches 102a and active patterns AP that are defined by the first trenches 102a. The active patterns AP may be line-shaped patterns that extend in the first direction D1 and may be spaced apart from each other in the second direction D2. When viewed in a sectional view, each of the active patterns AP may protrude upward from the top surface of the substrate 100. The second mask patterns 132 and the lower mask patterns 122 may be removed after the formation of the first trenches 102a.

In the present embodiments, a third mask pattern 180 may be formed on the substrate 100 to expose at least one of the active patterns AP. The third mask pattern 180 may include, for example, a SOH material.

Figure 18A:
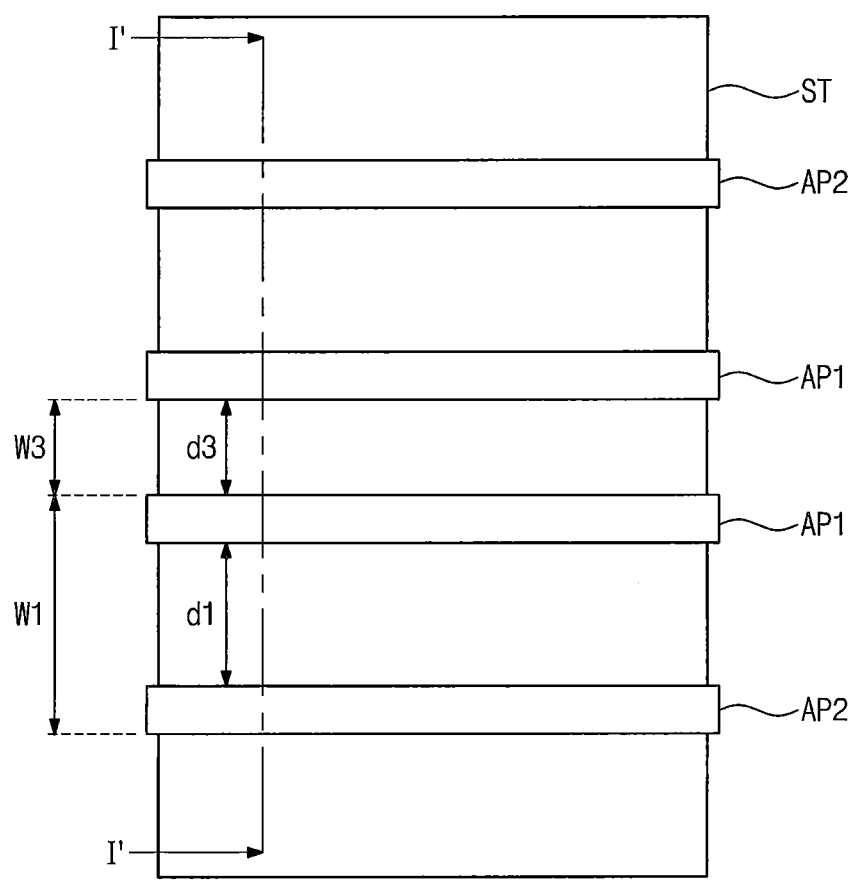
Figure 18B:
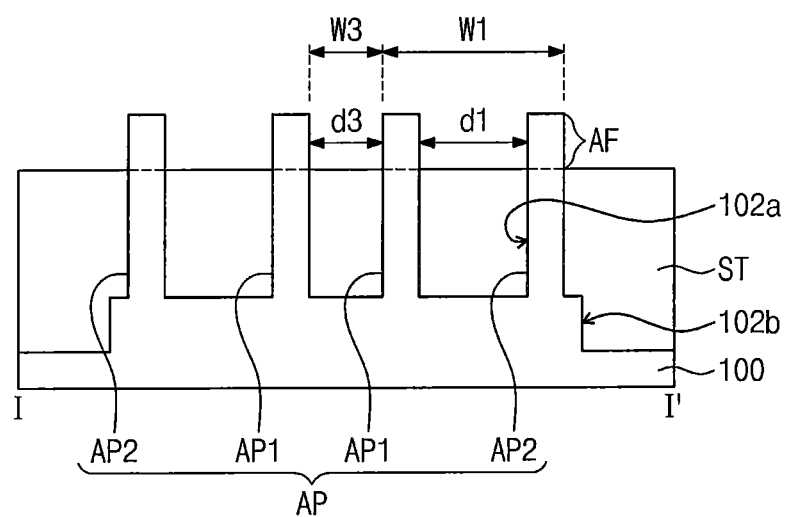

Referring to FIGS. 18A and 18B, the substrate 100 may be etched using the third mask pattern 180 as an etch mask to form second trenches 102b). The second trenches 102b may have bottom surfaces that are deeper than those of the first trenches 102a, when measured from the top surface of the substrate 100. At least one of the active patterns AP exposed by the third mask pattern 180 may be removed during the etching process.

The third mask pattern 180 may be removed after the formation of the second trenches 102b. The third mask pattern 180 may be removed using, for example, an ashing and/or stripping process.

Thereafter, the device isolation patterns ST may be formed to fill the first and second trenches 102a and 102b. The device isolation patterns ST may be formed using the process described above with reference to FIGS. 15A and 15B. Upper portions of the active patterns AP, which are exposed by the device isolation patterns ST may serve as active fins AF.

The active patterns AP may include first active patterns AP1 and second active patterns AP2, which have different conductivity types from each other. In the present embodiments, a pair of first active patterns AP1 and a pair of second active patterns AP2 may be provided on the substrate 100. The pair of second active patterns AP2 may be spaced apart from each other with the pair of first active patterns AP1 interposed therebetween. A first distance d1 between a first active pattern AP1 and a second active pattern AP2 that is adjacent thereto may be proportional to the first width W1 of the sacrificial pattern 150 that is described above with reference to FIG. 10B. The first distance d1 may be smaller than the first width W1 of the sacrificial pattern 150. In example embodiments, the first distance d1 may be substantially equal to the second width W5 of the first lower opening 124a that is described with reference to FIG. 14B. A third distance d3 between the first active patterns AP1 may be proportional to the maximum width W3 of the connection spacer 164 described above with reference to FIG. 10B. In example embodiments, the third distance d3 may be substantially equal to the maximum width W3 of the connection spacer 164.

According to example embodiments of the inventive concepts, six active patterns AP may be formed using a pair of the sacrificial patterns 150. In the case where a unit cell includes six active patterns AP as described above with reference to FIGS. 9A through 16A, an additional process for removing unnecessary active patterns AP may not be necessary. Further, in the case where the unit cell requires four active patterns AP, an additional process may be performed to remove the unnecessary active patterns AP.

Figure 19A:
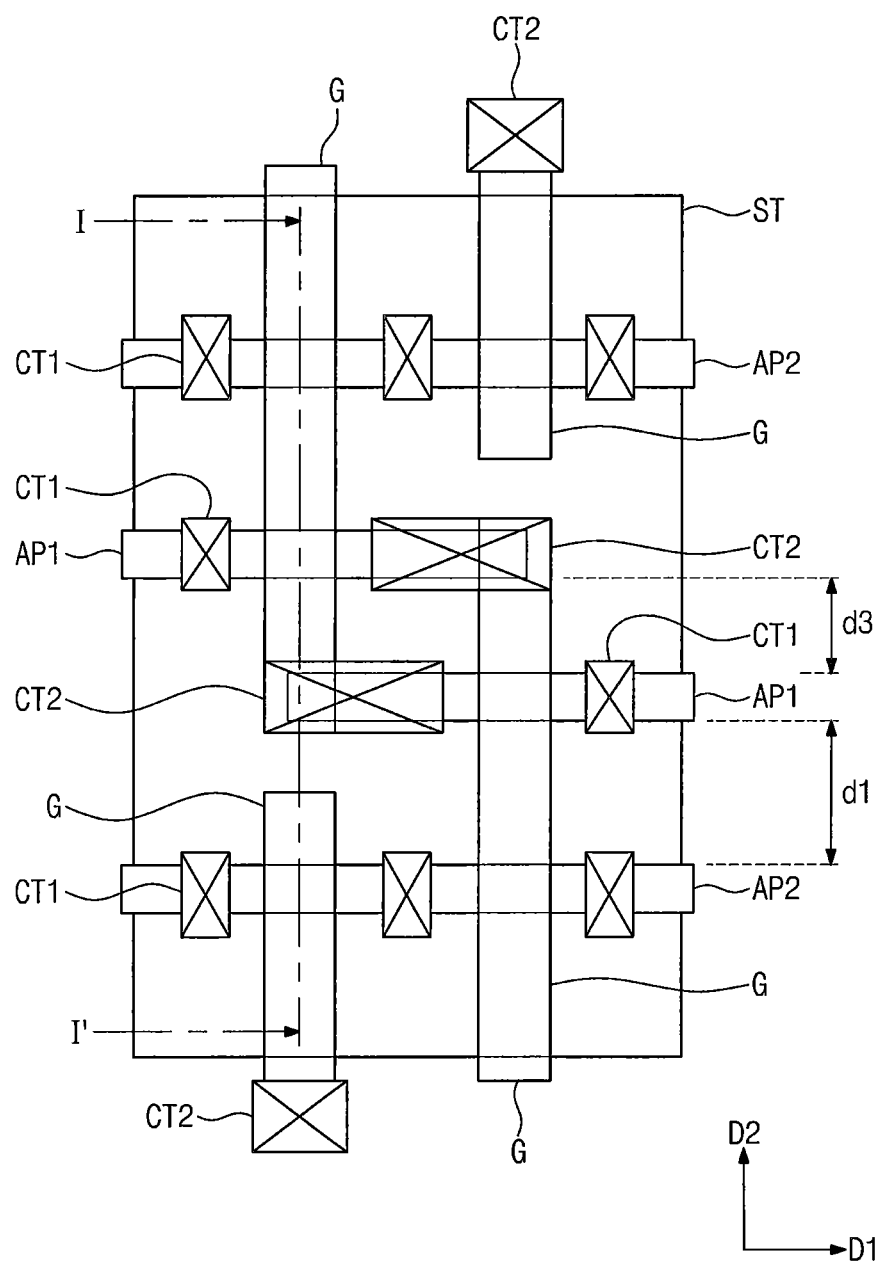
Figure 19B:
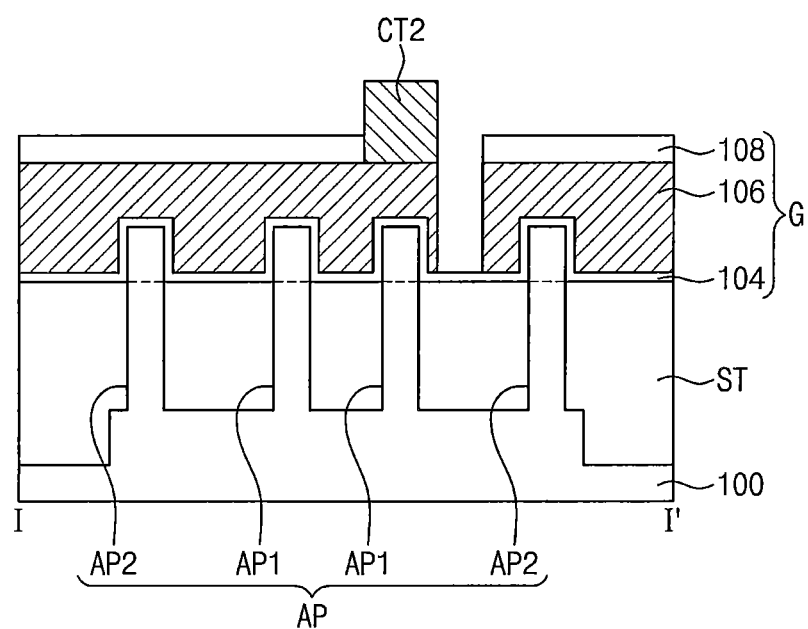

Referring to FIGS. 19A and 19B, gate structures G may be formed on the substrate 100 to cross the active patterns AP. Each of the gate structures G may include a gate dielectric pattern 104, a gate electrode 106, and a capping pattern 108, which are sequentially stacked on the substrate 100. Although not shown, gate spacers may be formed on the respective side surfaces of each of the gate structures G. In example embodiments, a portion of the first active pattern AP1 may be removed before the formation of the gate structures G. For example, when measured in the first direction D1, a length of the first active pattern AP1 may be shorter than that of the second active pattern AP2. Source/drain regions may be formed in or on portions of the active patterns AP, which are positioned at both sides of each gate structure G. Other portions of the active fins AF positioned below the gate structures G may serve as the channel regions of the transistors. Thereafter, first and second contacts CT1 and CT2 may be formed. The first contacts CT1 may be used to apply source/drain voltages to the source/drain regions, and the second contacts CT2 may be used to apply gate voltages to the gate electrodes 106.

FIGS. 16A, 19A, 20, and 21 are plan views illustrating layouts of SRAM bit cells that are formed using fine-patterning methods according to example embodiments of the inventive concepts. In the present specification, the term 'bit cell' refers to a unit cell configured to store one bit of data therein.

Referring to FIG. 16A, in some embodiments an SRAM bit cell may be provided that includes active patterns AP and device isolation patterns ST that define the active patterns. The active patterns AP may extend parallel to a first direction D1 and may be spaced apart from each other in a second direction D2 that crosses the first direction D1. The active patterns AP may include first active patterns AP1 and second active patterns AP2, which have different conductivity types from each other. In the example embodiment of FIG. 16A, a pair of first active patterns AP1 and two pairs of second active patterns AP2 may be provided in the bit cell. The pair of second active patterns AP2 may be spaced apart from another pair of second active patterns AP2, and the pair of first active patterns AP1 may be interposed therebetween.

In the present embodiments, a first distance d1 between a first active pattern AP1 and a second active pattern AP2 adjacent thereto, a second distance d2 between adjacent second active patterns AP2, and a third distance d3 between the first active patterns AP1 may be different from each other. In other words, active patterns with various pitches may be successively arranged.

In example embodiments, when measured in the first direction D1, a length of the first active pattern AP1 may be shorter than that of the second active pattern AP2. Gate structures G may cross over the active patterns AP1 and AP2, and each of the gate structures G may include a gate dielectric pattern, a gate electrode, and a capping pattern, which are sequentially stacked on the active patterns AP1 and AP2.

Source/drain regions may be formed in or on portions of the active patterns AP1 and AP2, which are positioned at both sides of each gate structure G. Other portions of the active patterns AP1 and AP2 positioned below the gate structures G may serve as channel regions of transistors constituting the bit cell. First and second contacts CT1 and CT2 may be provided in the bit cell. The first contacts CT1 may be used to apply source/drain voltages to the source/drain regions, and the second contacts CT2 may be used to apply gate voltages to the gate electrodes 106. Although not shown, an interconnection structure connected to the first and second contacts CT1 and CT2 may be provided in the bit cell. Accordingly, the bit cell may be used as a unit circuit capable of storing one bit of data.

Referring to FIG. 19A, in other embodiments, an SRAM bit cell may be provided that includes active patterns AP and device isolation patterns ST that define the active patterns AP. The active patterns AP may extend in a first direction D1 and may be spaced apart from each other in a second direction D2 that crosses the first direction D1. The active patterns AP may include first active patterns AP1 and second active patterns AP2, which have different conductivity types from each other.

A pair of first active patterns AP1 and a pair of second active patterns AP2 are provided in the bit cell. The pair of second active patterns AP2 may be spaced apart from each other with the pair of first active patterns AP1 interposed therebetween. A first distance d1 between a first active pattern AP1 and a second active pattern AP2 that is adjacent thereto and a third distance d3 between the first active patterns AP1 may be different from each other.

Except for these differences, the SRAM bit cell of FIG. 19A may be configured to have substantially the same features as those of FIG. 16A.

Figure 20:
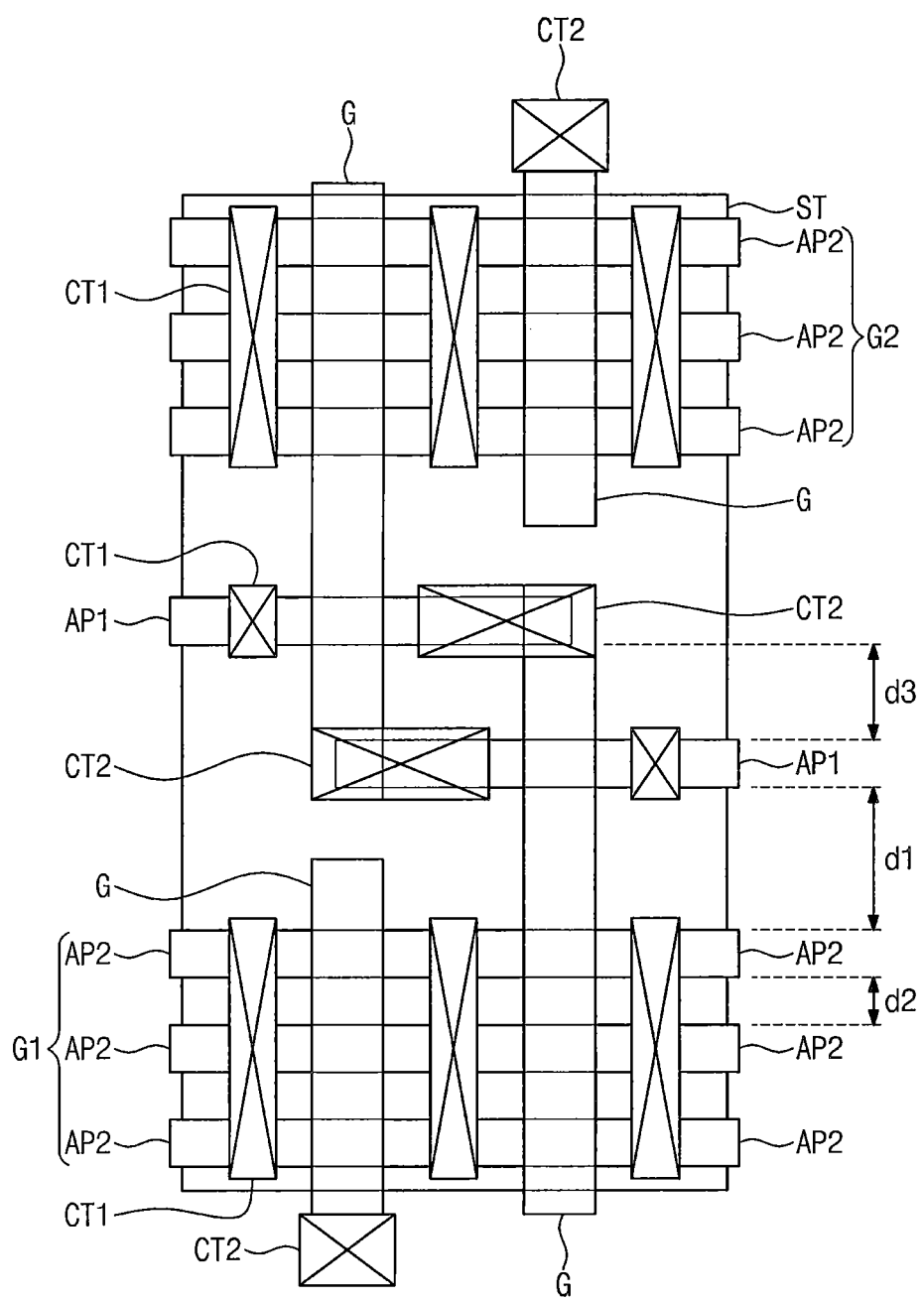
FIGS. 20 and 21, in conjunction with FIGS. 16A and 19A, are plan views illustrating layouts SRAM bit cells formed using fine-patterning methods according to example embodiments of the inventive concepts.

Referring to FIG. 20, in still other embodiments, an SRAM bit cell may be provided that includes active patterns AP and device isolation patterns ST that define the active patterns. The active patterns AP may extend in a first direction D1 and may be spaced apart from each other in a second direction D2 that crosses the first direction D1. The active patterns AP may include first active patterns AP1 and second active patterns AP2, which have different conductivity types from each other.

A pair of first active patterns AP1 and two groups of the second active patterns AP2 may be provided in the bit cell. For example, the second active patterns AP2 may include first and second groups G1 and G2, which are spaced apart from each other with the pair of first active patterns AP1 interposed therebetween, and each of which includes at least three second active patterns AP2.

Here, a first distance d1 between the first active pattern AP1 and the second active pattern AP2 that is adjacent thereto, a distance d2 between adjacent ones of the second active patterns AP2, and a third distance d3 between the first active patterns AP1 may be different from each other.

Except for these differences, the SRAM bit cell of FIG. 20 may be configured to have substantially the same features as those of FIG. 16A.

Figure 21:
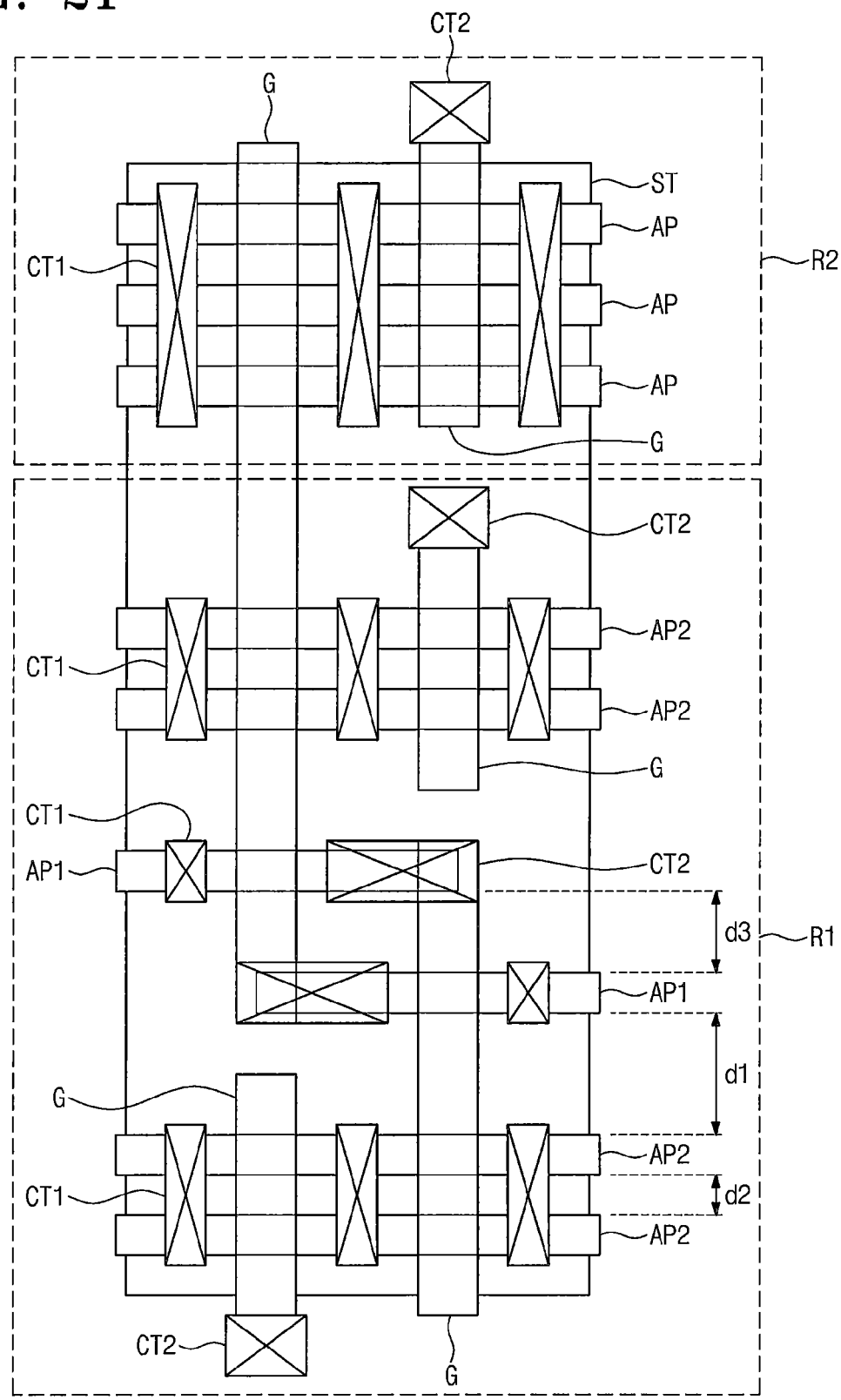

Referring to FIG. 21, in still further embodiments, an SRAM bit cell may be provided that includes active patterns AP and device isolation patterns ST that define the active patterns AP. The active patterns AP may include first active patterns AP1 and second active patterns AP2, which have different conductivity types from each other.

The bit cell may include a first region R1 and a second region R2, which may be separated from each other by the device isolation pattern ST. In example embodiments, a pair of first active patterns AP1 and two pairs of second active patterns AP2 may be provided in the first region R1. The two pairs of second active patterns AP2 may be spaced apart from one another, and the pair of first active patterns AP1 may be interposed therebetween. Further, at least three active patterns AP with the same conductivity type may be provided in the second region R2.

In the first region R1, a first distance d1 between a first active pattern AP1 and a second active pattern AP2 that is adjacent thereto, a second distance d2 between the second active patterns AP2 in a pair of second active patterns AP2, and a third distance d3 between the first active patterns AP1 may be different from each other.

Except for these differences, the SRAM bit cell of FIG. 21 may be configured to have substantially the same features as those of FIG. 16A.

Figure 22:
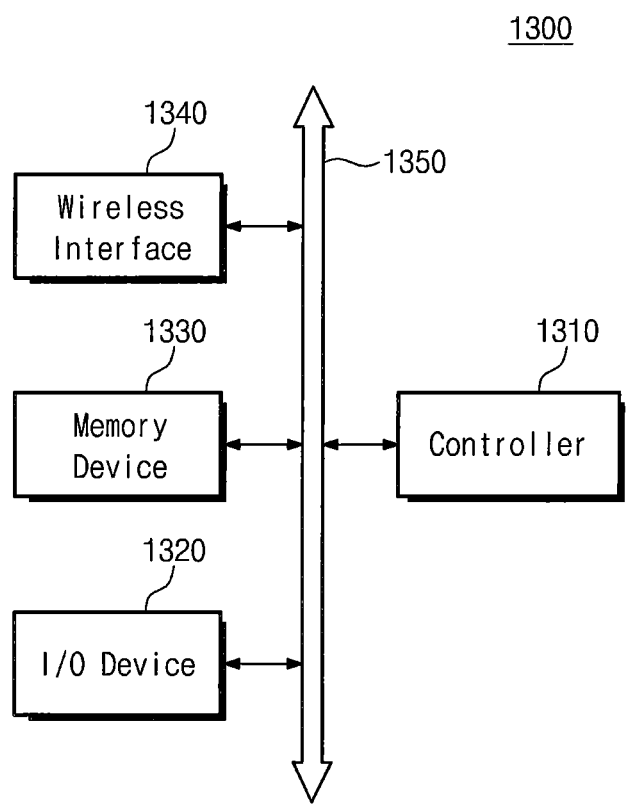
FIGS. 22 and 23 are block diagrams illustrating examples of electronic devices that include semiconductor devices fabricated by the above-described fine-patterning methods.
Figure 23:
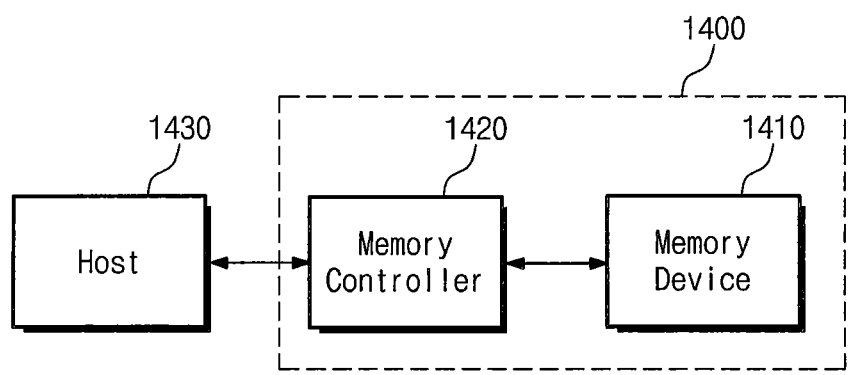

FIGS. 22 and 23 are block diagrams illustrating examples of electronic devices that include semiconductor devices fabricated according to the above-described fine-patterning methods.

Referring to FIG. 22, an electronic device 1300 may include a semiconductor device fabricated by the above-described fine-patterning method, and may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, and/or a display, a memory device 1330, and a wireless interface 1340 that are connected to each other through a bus 1350. The controller 1310 may include, for example, at least one microprocessor, a digital signal process, a microcontroller or the like. The memory device 1330 may be configured to store a command code to be used by the controller 1310 and/or user data. The memory device 1330 may include a semiconductor device according to example embodiments of the inventive concepts. The electronic device 1300 may use a wireless interface 1340 that is configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 23, a memory system including a semiconductor device fabricated by the above-described fine-patterning method will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may include semiconductor devices according to example embodiments of the inventive concepts.

The semiconductor devices disclosed above may be encapsulated using various and diverse packaging techniques. For example, semiconductor devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above example embodiments is mounted may further include at least one semiconductor device (e.g., a controller and/or a logic device) that controls the semiconductor device.

According to example embodiments of the inventive concepts, widths of successively-arranged openings can be controlled by adjusting widths of and distances between sacrificial patterns and a deposition thickness of a spacer layer. This makes it possible to achieve a variety of pitches for successively-arranged patterns. Further, this method makes it possible to realize a variety of pitches of active patterns that are successively arranged in a semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A fine-patterning method, comprising:
   forming a mask layer on an underlying layer, the mask layer including a first mask layer on the underlying layer and a second mask layer between the underlying layer and the first mask layer;
   forming a pair of sacrificial patterns on the mask layer;
   forming a connection spacer and first spacers, the connection spacer filling a space between the sacrificial patterns, the first spacers spaced apart from each other with the sacrificial patterns interposed therebetween, the first spacers covering respective outer side surfaces of the sacrificial patterns;
   etching the first mask layer using the first spacers and the connection spacer as an etch mask to form first mask patterns;
   forming second spacers to cover side surfaces of each of the first mask patterns;
   etching the second mask layer using the second spacers as an etch mask to form second mask patterns; and
   etching the underlying layer using the second mask patterns as an etch mask.

2. The method of claim 1, wherein forming the connection spacer and the first spacers comprises:
   forming a first spacer layer on the mask layer that conformally covers the sacrificial patterns; and
   anisotropically etching the first spacer layer to expose top surfaces of the sacrificial patterns and the mask layer,
   wherein a first distance between the sacrificial patterns is smaller than or substantially equal to two times a thickness of the first spacer layer.

3. The method of claim 2, wherein the first distance is one to two times the thickness of the first spacer layer.

4. The method of claim 2, wherein the sacrificial patterns each extend in a first direction and are spaced apart from each other by the first distance in a second direction that is substantially perpendicular to the first direction, and
   wherein each of the first spacers has a maximum width in the second direction that is substantially equal to the thickness of the first spacer layer.

5. The method of claim 1, wherein the sacrificial patterns extend in a first direction and are spaced apart from each other by a first distance in a second direction that is substantially perpendicular to the first direction, and
   wherein a maximum width of the connection spacer in the second direction is substantially equal to the first distance between the sacrificial patterns.

6. The method of claim 1, wherein the sacrificial patterns are spaced apart from each other along a second direction, and wherein a maximum width of the connection spacer in the second direction is smaller than or substantially equal to two times a maximum width of each of the first spacers in the second direction.

7. The method of claim 6, wherein the maximum width of the connection spacer is one to two times the maximum width of each of the first spacers.

8. The method of claim 1, further comprising:
   removing the sacrificial patterns before forming the first mask patterns, and
   removing the first spacers and the connection spacer after the forming of the first mask patterns, and
   wherein forming the second spacers comprises:
   forming a second spacer layer on the second mask layer to conformally cover the first mask patterns; and
   anisotropically etching the second spacer layer to expose top surfaces of the first mask patterns and the second mask layer.

9. The method of claim 1, wherein the connection spacer comprises the same material as the first spacers.

10. The method of claim 1, further comprising providing a substrate below the underlying layer,
    wherein the sacrificial patterns are spaced apart from each other in a second direction, and
    wherein the underlying layer is etched to form lower openings that expose the substrate, the lower openings including first, second, and third lower openings which are arranged along the second direction and whose widths are proportional to a width of the sacrificial pattern, a maximum width of one of the first spacers, and a maximum width of the connection spacer, respectively, when measured in the second direction.

11. The method of claim 10, wherein forming the connection spacer and the first spacers comprises:

forming a first spacer layer on the mask layer that conformally covers the sacrificial patterns; and anisotropically etching the first spacer layer to expose top surfaces of the sacrificial patterns and the mask layer, wherein the maximum width of the first spacer is controlled by adjusting a thickness of the first spacer layer.

12. The method of claim 10, wherein the maximum width of the connection spacer is controlled by adjusting a distance between the sacrificial patterns.

13. The method of claim 10, wherein the widths of the first, second, and third lower openings are different from each other.

14. A method of fabricating a semiconductor device, comprising:

forming a first mask layer on a substrate;

forming a first sacrificial pattern and a second sacrificial pattern on the first mask layer, the first and second sacrificial patterns each extending in a first direction and spaced apart from each other in a second direction that crosses the first direction, each of the first and second sacrificial patterns having first and second sidewalls that extend in the first direction;

forming a first spacer layer on the first mask layer that conformally covers the first and second sacrificial patterns;

anisotropically etching the first spacer layer to form a connection spacer that extends from the first sidewall of the first sacrificial pattern to the first sidewall of the second sacrificial pattern and to form respective first spacers on the second sidewalls of the first and second sacrificial patterns;

etching the substrate to form first and second active patterns that have a first conductivity type and third and fourth active patterns that have a second conductivity type that is opposite the first conductivity type, wherein a second distance between the third active pattern and the fourth active pattern is substantially equal to a width of the first spacer in the second direction, and wherein a third distance between the first active pattern and the second active pattern is substantially equal to a width of the connection spacer in the second direction.

15. The method of claim 14, wherein each of the first spacers has a maximum width in the second direction that is substantially equal to the thickness of the first spacer layer.

16. The method of claim 15, wherein a first distance between the second active pattern and the third active pattern is less than a width of the first sacrificial pattern in the second direction.

17. The method of claim 14, wherein etching the substrate to form first and second active patterns that have the first conductivity type and third and fourth active patterns that have the second conductivity type that is opposite the first conductivity type comprises:

etching the first mask layer using the first spacers and the connection spacer as an etch mask to form first mask patterns;

forming second spacers to cover side surfaces of each of the first mask patterns;

etching a second mask layer that is between the first mask layer and the substrate using the second spacers as an etch mask to form second mask patterns.

18. The method of claim 17, further comprising etching an underlying layer that is between the second mask layer and the substrate using the second mask patterns as an etch mask.

19. The method of claim 14, wherein a distance between the sacrificial patterns is smaller than or substantially equal to two times a thickness of the first spacer layer.

20. The method of claim 14, wherein the first through fourth active patterns are arranged in numerical order along the second direction.

* * * * *